(12) United States Patent
Morreale

(10) Patent No.: US 10,283,674 B2
(45) Date of Patent: May 7, 2019

(54) GRAPHENE-BASED SOLID STATE DEVICES CAPABLE OF EMITTING ELECTROMAGNETIC RADIATION AND IMPROVEMENTS THEREOF

(71) Applicant: P-Brane, LLC, Summit, NJ (US)

(72) Inventor: Jay P. Morreale, Summit, NJ (US)

(73) Assignee: P-BRANE, LLC, Summit, NJ (US)

( * ) Notice: Subject to any disclaimer, the term of this patent is extended or adjusted under 35 U.S.C. 154(b) by 0 days.

(21) Appl. No.: 15/696,796

(22) Filed: Sep. 6, 2017

(65) Prior Publication Data

US 2018/0019379 A1   Jan. 18, 2018

Related U.S. Application Data

(63) Continuation of application No. 14/235,184, filed as application No. PCT/US2012/048453 on Jul. 27, 2012, now Pat. No. 9,793,437.
(Continued)

(51) Int. Cl.
| H01L 33/34 | (2010.01) |
| H01L 29/16 | (2006.01) |
| H01L 29/786 | (2006.01) |
| H01L 33/00 | (2010.01) |
| H01L 33/04 | (2010.01) |
| H01L 33/36 | (2010.01) |
| H01L 51/52 | (2006.01) |
| H05H 13/04 | (2006.01) |

(Continued)

(52) U.S. Cl.
CPC .......... *H01L 33/34* (2013.01); *H01L 29/1606* (2013.01); *H01L 29/78684* (2013.01); *H01L 33/0041* (2013.01); *H01L 33/04* (2013.01); *H01L 33/36* (2013.01); *H01L 51/5296* (2013.01); *H05H 13/04* (2013.01); *H01L 21/02527* (2013.01); *H01L 21/02587* (2013.01); *H01L 29/82* (2013.01)

(58) Field of Classification Search
CPC ..... H01L 29/1606; H01L 29/82; H01L 31/09; H01L 43/08
See application file for complete search history.

(56) References Cited

U.S. PATENT DOCUMENTS 4,779,277 A * 10/1988 Gover .................. H01S 3/0903
372/2
2007/0187694 A1   8/2007 Pfeiffer
(Continued)

FOREIGN PATENT DOCUMENTS

WO   WO 2013/016601 A1   1/2013

OTHER PUBLICATIONS

Bonaccorso et al., "Graphene Photonics and Optoelectronics", Jun. 24, 2010, http://arxiv.org/pdf/1006.4854.pdf> p. 3, Section D.
(Continued)

*Primary Examiner* — David C Spalla
(74) *Attorney, Agent, or Firm* — Baker & Hostetler LLP

(57) ABSTRACT

Described herein are solid-state devices based on graphene in a Field Effect Transistor (FET) structure that emits high frequency Electromagnetic (EM) radiation using one or more DC electric fields and periodic magnetic arrays or periodic nanostructures. A number of devices are described that are capable of generating and emitting electromagnetic radiation.

22 Claims, 22 Drawing Sheets

Related U.S. Application Data

(60) Provisional application No. 61/512,145, filed on Jul. 27, 2011, provisional application No. 61/642,038, filed on May 3, 2012.

(51) Int. Cl.
*H01L 21/02* (2006.01)
*H01L 29/82* (2006.01)

(56) References Cited

U.S. PATENT DOCUMENTS

| | | |
|---|---|---|
| 2009/0140801 A1 | 6/2009 | Ozyilmaz et al. |
| 2010/0006823 A1 | 1/2010 | Anderson et al. |
| 2010/0109712 A1 | 5/2010 | Zaliznyak et al. |
| 2010/0127243 A1 | 5/2010 | Banerjee et al. |
| 2010/0200755 A1* | 8/2010 | Kawano .......... H01L 31/09 250/338.4 |
| 2011/0037464 A1 | 2/2011 | Gurney et al. |
| 2011/0042649 A1 | 2/2011 | Duvall et al. |
| 2011/0089404 A1 | 4/2011 | Marcus et al. |
| 2012/0119837 A1* | 5/2012 | Blick .......... H01Q 1/2283 331/74 |
| 2012/0270054 A1* | 10/2012 | Hong .......... B29B 15/08 428/408 |
| 2014/0085711 A1* | 3/2014 | Sonkusale .......... H01P 7/082 359/350 |
| 2015/0063379 A1 | 3/2015 | Ou et al. |

OTHER PUBLICATIONS

Essig et al, "Phonon-Assisted Electroluminescence from Metallic Carbon Nanotubes and Graphene", Nano Letters, Dec. 2010, p. 1590, http://www-g.eng.cam.ac.uklnms/publications/pdf/Essig_nanolett_2010.

Fedorchenko, "Radiation Emission From Wrinkled SiGe/SiGe Nanostructure", Appls. Phys., Lett., Mar. 2010, 96(11), 113104.

International Patent Application No. PCT/US2012/048453: International Search Report dated Jul. 27, 2011, 5 pages.

K&J Magnetics, "Source World's Strongest Magnets", www.kjmagnetics.com, 2016, accessed Jan. 6, 2016, 4 pages.

Nimrod, "Distributing Copper Foil", www.nimrodcopper.com, 2016, accessed Jan. 6, 2016, 3 pages.

* cited by examiner

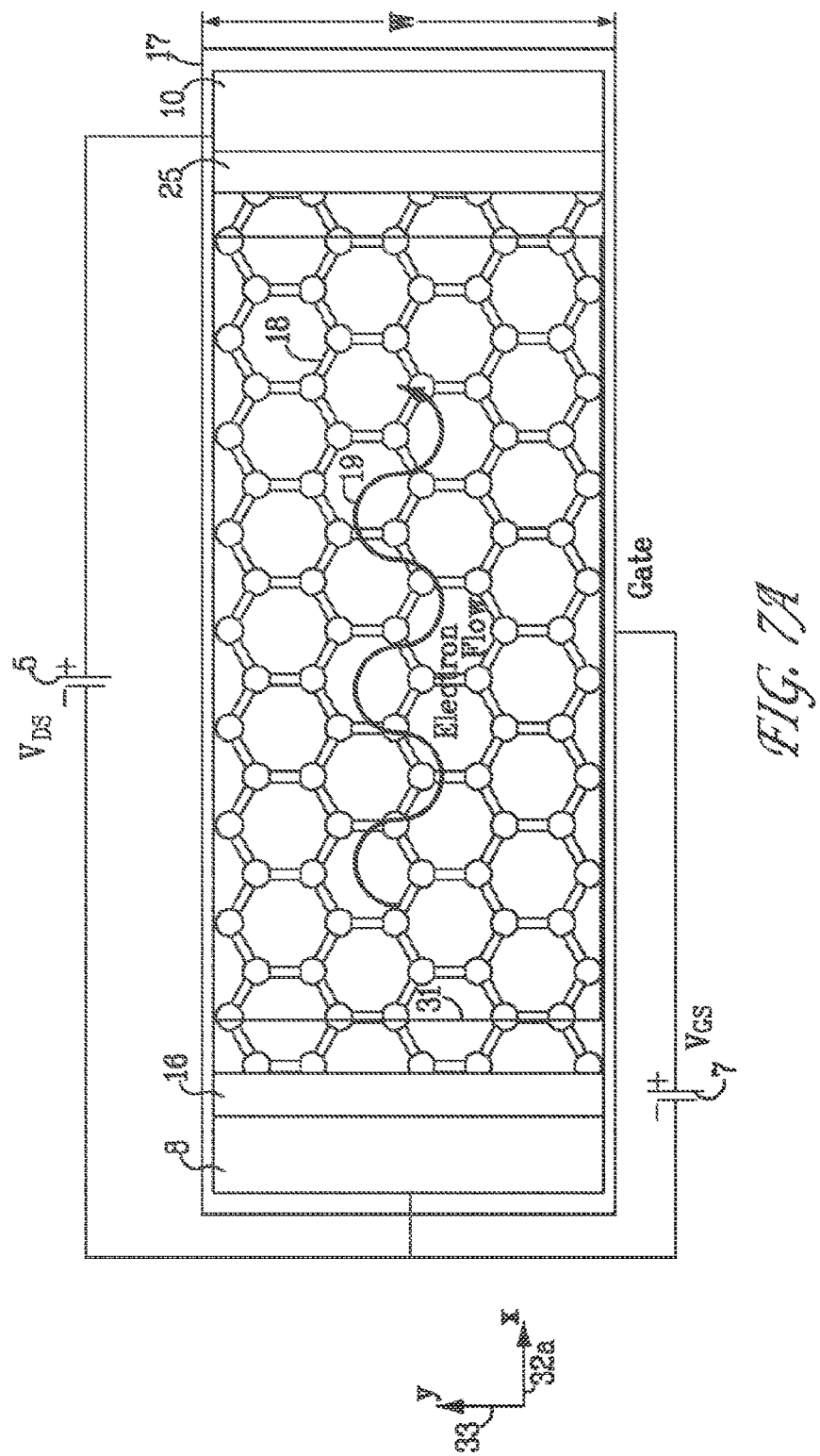

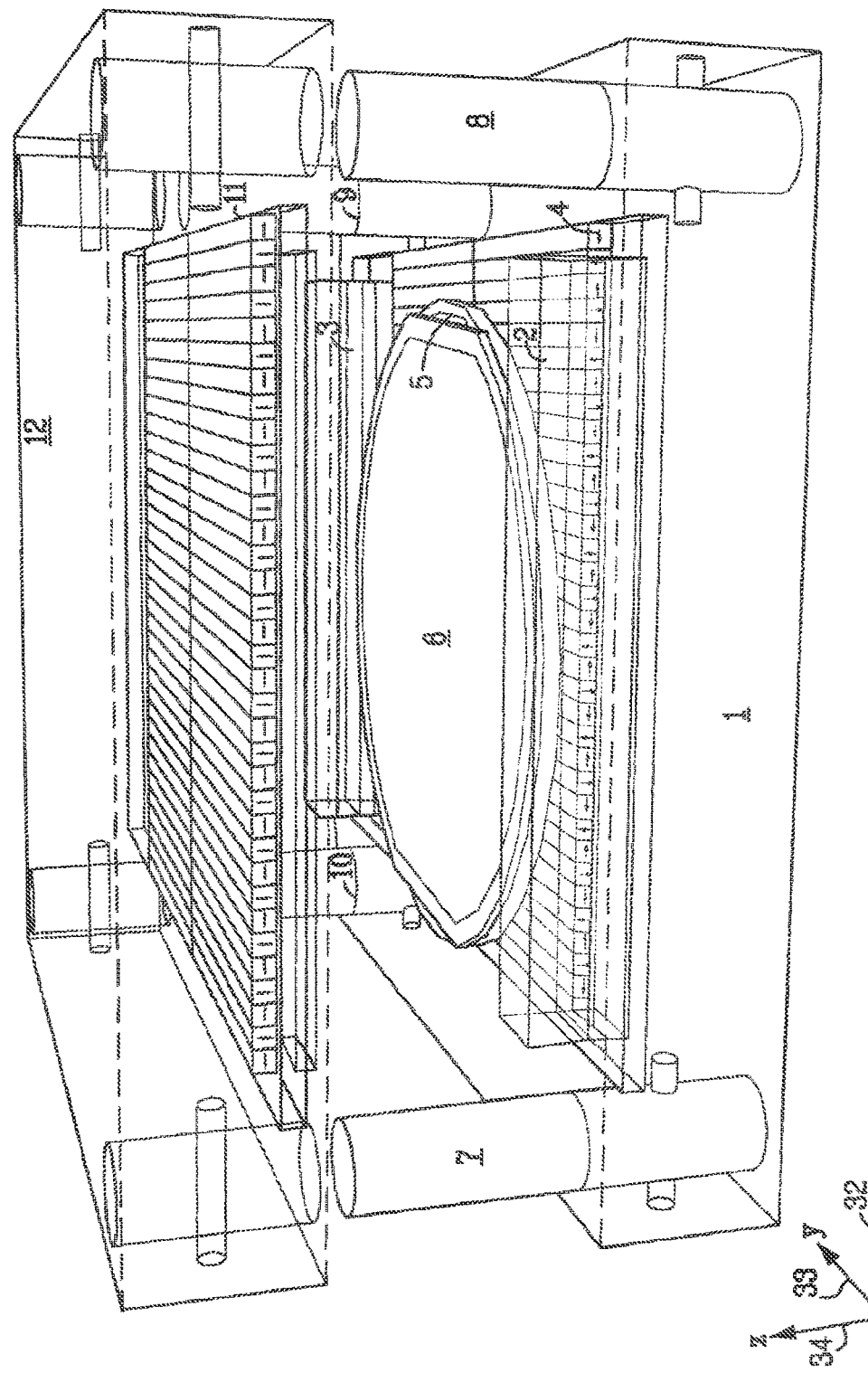

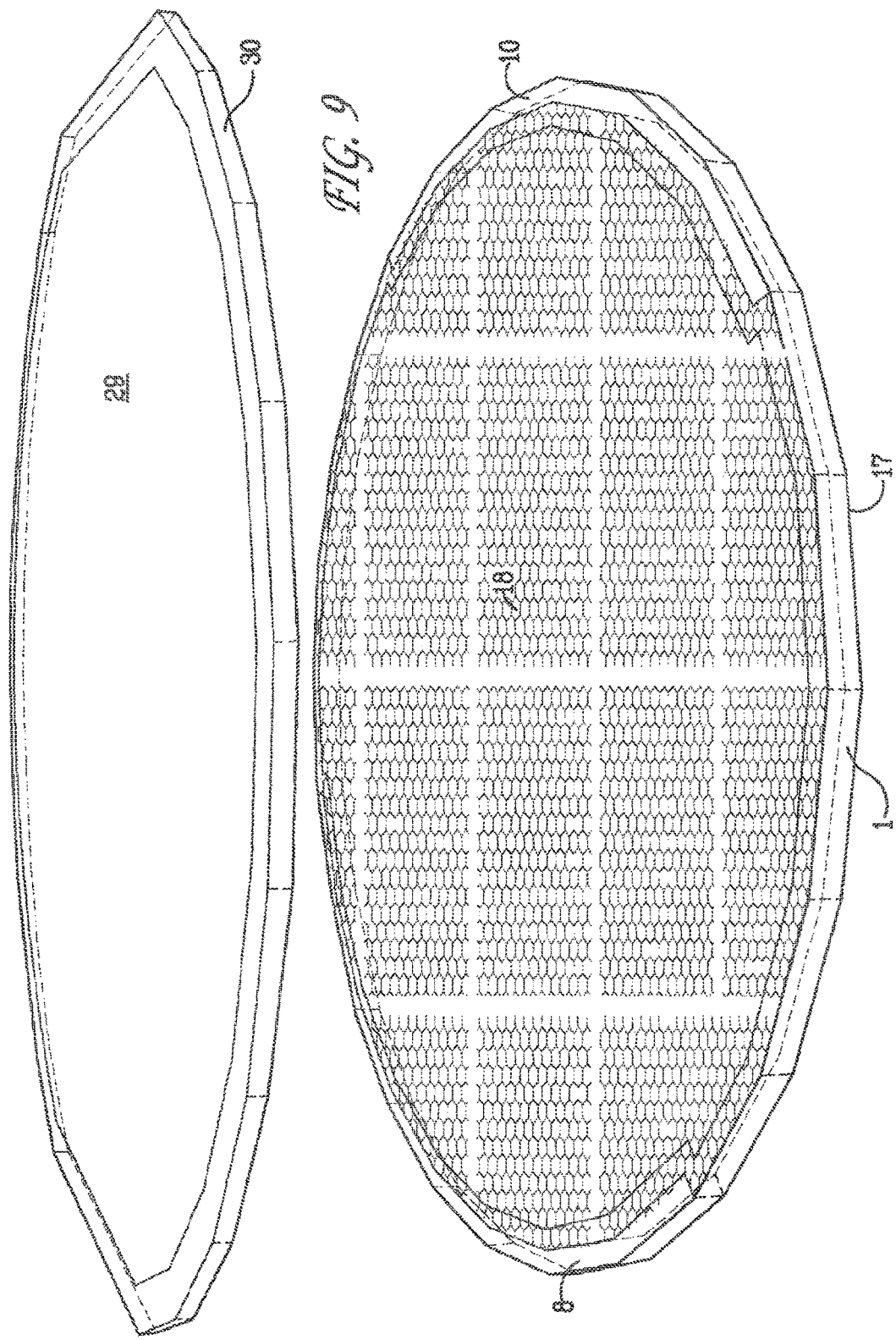

| Parameter | Variable | Value |
|---|---|---|
| Magnet composition | | NdFeB |
| Magnet dimensions | | 0.125 x 0.125 x 1.0 |
| Magnet field period | $\lambda u$ | 1.3 cm |
| Number of magnets | Nm | 35 |
| Array length | La=0.125*Nm | 4.375 inches |
| Number of periods | Nu=(Nm-3) *0.125/$\lambda u$ | 8 |
| Active undulator length | Lu=$\lambda u$ Nu | 10.2 cm |
| Magnetic field strength (ave) | Ba | 0.8 Tesla |
| Pull force at 0.4 to 0.2 in separation | Fp | 28 to 126 lbs |
| Array magnetic field strength @ 0.2 in | Bo | 0.15 Tesla * 2 |
| Graphene area between contacts | Ag | 9.82 in$^2$=63.4 cm$^2$ |
| Graphene electron velocity | Vf | 1*10$^7$ cm/s to 1*10$^8$ cm/s |
| Gate capacitance | Cg | 7.23*10$^{-9}$ Farads/cm$^2$ |
| Gate thickness | td1 | 300 nm |
| Drain-to-source voltage | Vds | 0 to 41,000V |
| Graphene drain-to-source length | | 5.8 to 9.9 cm |
| E-field strength max | Ex | 0 V/cm to 7069 V/cm |
| Gate-to-source voltage range | Vgs | 0 to 100 V |
| Graphene carrier velocity (Vx) | Vx | 9.03*10$^7$ cm/Second |
| Max carrier density before Vx limits | n1ep | 1.67 10$^{12}$/cm$^2$ |
| Gate voltage at n1ep without reflector | Vglep | 37.2 Volt |
| Gate voltage at n1ep with reflector | Vglepref | 23.4 Volt |
| Total carrier density | n1a=n1ep*Ag | 1.06*10$^{14}$ |
| Peak acceleration (from Bo) | a | 3.9*10$^{20}$ cm/Second$^2$ |
| Electron output power | Pe | 4.3*10$^{-17}$ Watt |
| Power out at Vglep | Pevglep | 0.72 mW/cm$^2$ |
| Power out wafer area | Pwafer | 4.6 mW |
| Output frequency | Fout | 702 MHz |

*FIG. 11*

| Parameter | Variable | Value |
|---|---|---|
| Magnet composition | | NdFeB |
| Magnet dimensions | | 2 x 2 x 2 inches |
| Graphene corrugation period | $\lambda u$ | 100 nm |
| Number of magnets | Nm | 4 |
| Array length | La=2 * Nm | 4 inches |
| Number of periods | Nu=Lu/$\lambda u$ | NA |
| Magnetic field strength (ave) | Ba | 0.4933 Tesla |
| Pull force at 0.4 to 0.2 in separation | Fp | 178 to 1226 lbs |
| Array magnetic field strength @ 0.2 in | Bo | 0.74 Tesla |
| Graphene area between contacts | Ag | 9.82 in$^2$=63.4 cm$^2$ |
| Graphene electron velocity | Vf | 1*10$^7$cm/s to 1*10$^8$cm/s |
| Gate capacitance | Cg | 7.23*10$^{-9}$ Farads/cm$^2$ |
| Gate thickness | td1 | 300 nm |
| Drain-to-source voltage | Vds | 0 to 41,000V |
| Graphene drain-to-source length | Lds | 5.8 to 9.9 cm |
| E-field strength max | Ex | 0 V/cm to 7100 V/cm |
| Gate-to-source voltage range | Vgs | 0 to 100 V |
| Graphene carrier velocity (Vx) | Vx | 9.03*10$^8$ cm/Second |
| Max carrier density before Vx limits | nlep | 1.67 10$^{12}$/cm$^2$ |
| Gate voltage at nlep without reflector | Vglep | 37.2 Volt |
| Gate voltage at nlep with reflector | Vglepref | 23.4 Volt |
| Total carrier density | nla=nlep*Ag | 1.06*10$^{14}$ |
| Peak acceleration (from Bo) | a | 5.6*10$^{20}$ cm/Second$^2$ |
| Electron output power | Pe | 9.0*10$^{-17}$ Watt |
| Power out at Vglep | Pevglep | 151 $\mu$W/cm$^2$ |
| Power out wafer area | Pwafer | 9.7 mW |
| Output frequency | Fout | 99 THz |

*FIG. 19*

GRAPHENE-BASED SOLID STATE DEVICES CAPABLE OF EMITTING ELECTROMAGNETIC RADIATION AND IMPROVEMENTS THEREOF

CROSS-REFERENCE TO RELATED APPLICATIONS

This application is a continuation of U.S. application Ser. No. 14/235,184, filed Apr. 15, 2014, which claims priority to International Application No. PCT/US2012/048453, filed Jul. 27, 2012, which claims priority to U.S. Provisional Application No. 61/512,145, filed Jul. 27, 2011, and U.S. Provisional Application No. 61/642,038, filed May 3, 2012, the disclosures of which are incorporated by reference in their entirety.

TECHNICAL FIELD

The disclosed inventions are in the field of graphene devices. The disclosed inventions are also in the field of devices for generating and emitting electromagnetic radiation.

BACKGROUND

Graphene is a single atomic sheet of graphitic carbon atoms forming honeycomb (hexagonal) lattice. Suitable views of graphene include a two-dimensional Fullerene molecule, an unrolled single wall carbon nanotube, or simply a single layer of lamellar graphite crystal. Graphene has very high electron mobility values at room temperature, hence graphene is potentially attractive for electromagnetic radiation applications and electron emitters. However, plenty of work is needed for developing graphene-based devices for generating and emitting electromagnetic radiation.

SUMMARY

The general description and the following detailed description are exemplary and explanatory only and are not restrictive of the invention, as defined in the appended claims. Other aspects of the present invention will be apparent to those skilled in the art in view of the detailed description of the invention as provided herein.

Accordingly, the present invention provides solid state devices capable of emitting electromagnetic radiation, comprising: a gate layer capable of controlling electron density in one or more upper layers; a first dielectric layer disposed adjacent to the gate layer; a graphene layer disposed adjacent to the at least one first dielectric layer; a source disposed adjacent to, and in electrical communication with, the graphene layer; a drain disposed adjacent to, and in electrical communication with, the graphene layer, wherein the source and the drain are disposed at distal ends of the graphene layer, wherein application of an electromotive force between the source and drain gives rise to an electrical current in the graphene layer; and an alternating magnetic field source disposed proximate to the at least one graphene layer, wherein operation of the alternating magnetic field source gives rise to an alternating magnetic field oriented substantially perpendicular to the graphene layer, wherein said alternating magnetic field is capable of being operatively coupled to said electrical current to give rise the electromagnetic radiation produced from the graphene layer. The disclosed devices are capable of operating as a "synchrotron on a chip".

The present invention further provides solid-state devices capable of emitting electromagnetic radiation, comprising: graphene disposed in a field effect transistor structure capable of generating an electric current within the graphene when actuated by an electric potential; and a periodic magnetic array disposed proximate to the field effect transistor structure, wherein the periodic magnetic array is capable of laterally accelerating the electric current within the graphene to give rise to electromagnetic radiation emitted from the solid-state device.

Also provided are solid-state devices capable of emitting electromagnetic radiation, comprising: graphene disposed in a Field Effect Transistor structure; an electric potential source operatively coupled to the graphene to give rise to an electric current within the graphene; and a source for generating alternating magnetic flux lines perpendicular and through the graphene, wherein the alternating magnetic flux lines are capable of laterally accelerating the electrons within the graphene to give rise to electromagnetic radiation emitted from the solid-state device.

The present invention further provides solid-state device capable of emitting electromagnetic radiation, comprising: graphene disposed in a Field Effect Transistor structure; an electric potential source operatively coupled to the graphene to give rise to an electric current within the graphene; and a source for generating alternating magnetic flux lines perpendicular and through the graphene, wherein the alternating magnetic flux lines are capable of laterally accelerating the electrons within the graphene to give rise to electromagnetic radiation emitted from the solid-state device.

Also provided are solid-state devices capable of emitting electromagnetic radiation, comprising: a plurality of graphene nanoribbons disposed in a field effect transistor structure, the graphene nanoribbons characterized as curved periodic paths; an electric potential source operatively coupled to each of the graphene nanoribbons to give rise to an electric current in a curved periodic path in each of the graphene nanoribbons; and a magnetic field source disposed proximate to the field effect transistor structure to give rise to a magnetic field passing through the graphene nanoribbons, wherein the interaction between the electric current in a curved periodic path with the magnetic flux gives rise to electromagnetic radiation emitted from the solid-state device.

The present invention further provides solid-state devices capable of emitting electromagnetic radiation, comprising: a corrugated graphene layer disposed in a field effect transistor structure; an electric potential source operatively coupled to the corrugated graphene layer to give rise to a corrugated electric current within the field effect transistor structure; and a source for generating a magnetic field parallel to the corrugated graphene layer, wherein the corrugated electric current passing through the field effect transistor structure in the presence of the magnetic field gives rise to electromagnetic radiation emitted from the solid-state device.

Also provided are electron accelerators, comprising: an electric potential source operatively coupled to graphene to give rise to an electric current within the graphene; and a magnetic field source disposed proximate to the graphene, wherein the magnetic field source is capable of generating a magnetic field perpendicular to the electric current to give rise to lateral acceleration of the electrons within the graphene.

The present invention further provides methods of generating electromagnetic radiation, comprising: inducing an electric current in a graphene layer using an electromotive force; and accelerating electrons in the graphene layer tangential to the direction of the electromotive force and within the graphene layer using an alternating magnetic field oriented substantially perpendicular to the graphene layer, wherein the acceleration of the electrons gives rise to electromagnetic radiation.

Also provided are methods of generating electromagnetic radiation, comprising: inducing a current in a graphene layer, the graphene layer comprising multiple parallel paths using an electromotive force, the direction of current being substantially parallel to the periodic path; and accelerating electrons in the graphene layer tangential to the direction of the periodic path and within the graphene layer using an constant magnetic field proximate and perpendicular to the graphene layer, wherein the acceleration of the electrons gives rise to electromagnetic radiation.

The present invention further provides methods of accelerating electrons in a solid-state device, comprising: inducing a current in a graphene layer using an electromotive force, the direction of current being substantially parallel to the direction of the electromotive force; and accelerating electrons in the graphene layer tangential to the direction of the electromotive force and within the graphene layer using an alternating magnetic field proximate and perpendicular to the graphene layer.

Further provided are methods of making a solid state device capable of emitting electromagnetic radiation, the method comprising: fabricating a field effect transistor structure comprising a plurality of layers, the plurality of layers comprising, a gate layer; a first dielectric layer disposed adjacent to the gate layer; a graphene layer disposed adjacent to the first dielectric layer; a source disposed adjacent to, and in electrical communication with, the graphene layer; a drain disposed adjacent to, and in electrical communication with, the graphene layer, wherein the source and the drain are disposed at distal ends of the graphene layer; and disposing an alternating magnetic field source proximate to the field effect transistor structure.

The present invention also provides methods for patterning graphene on copper, comprising depositing a first copper thin film on a dielectric layer, the dielectric layer directly adjacent to a silicon layer, the silicon layer adjacent to a first metal layer, the first metal layer adjacent to a second metal layer; depositing simultaneously or sequentially, or both, with the first thin film copper a second copper thin film on the second metal layer; growing simultaneously or sequentially, or both, a first graphene layer on the first and second copper thin films; depositing a first and second photoresist layer, respectively, on the first and second copper thin films; patterning at least one or the first or second photoresist layers; removing at least a portion of one or both of the first and second copper thin films; removing any remaining photoresist; depositing a first and second photoresist layer respectively on the first and second graphene layers; and removing at least a portion of one or both of the first and second graphene layers.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 7A illustrates a top-down view of an embodiment of a solid device according to the present invention.

FIG. 8 depicts a perspective 3D drawing of an embodiment of a solid state device according to the present invention.

FIG. 9 depicts a perspective 3D drawing of a portion of a solid state device according to the present invention showing a Graphene FET (bottom) and Reflector (top).

FIG. 11 lists a table of an exemplification of Prototype Operating and Performance Parameters, Variables, and Values, for operating an embodiment of a solid state device according to the present invention.

FIG. 19 lists a table of an exemplification of Prototype Operating and Performance Parameters, Variables, and Values, for operating an embodiment of a solid state device according to the present invention in connection with a Corrugated Graphene FET Emitter.

DETAILED DESCRIPTION OF ILLUSTRATIVE EMBODIMENTS

Figure 1A:
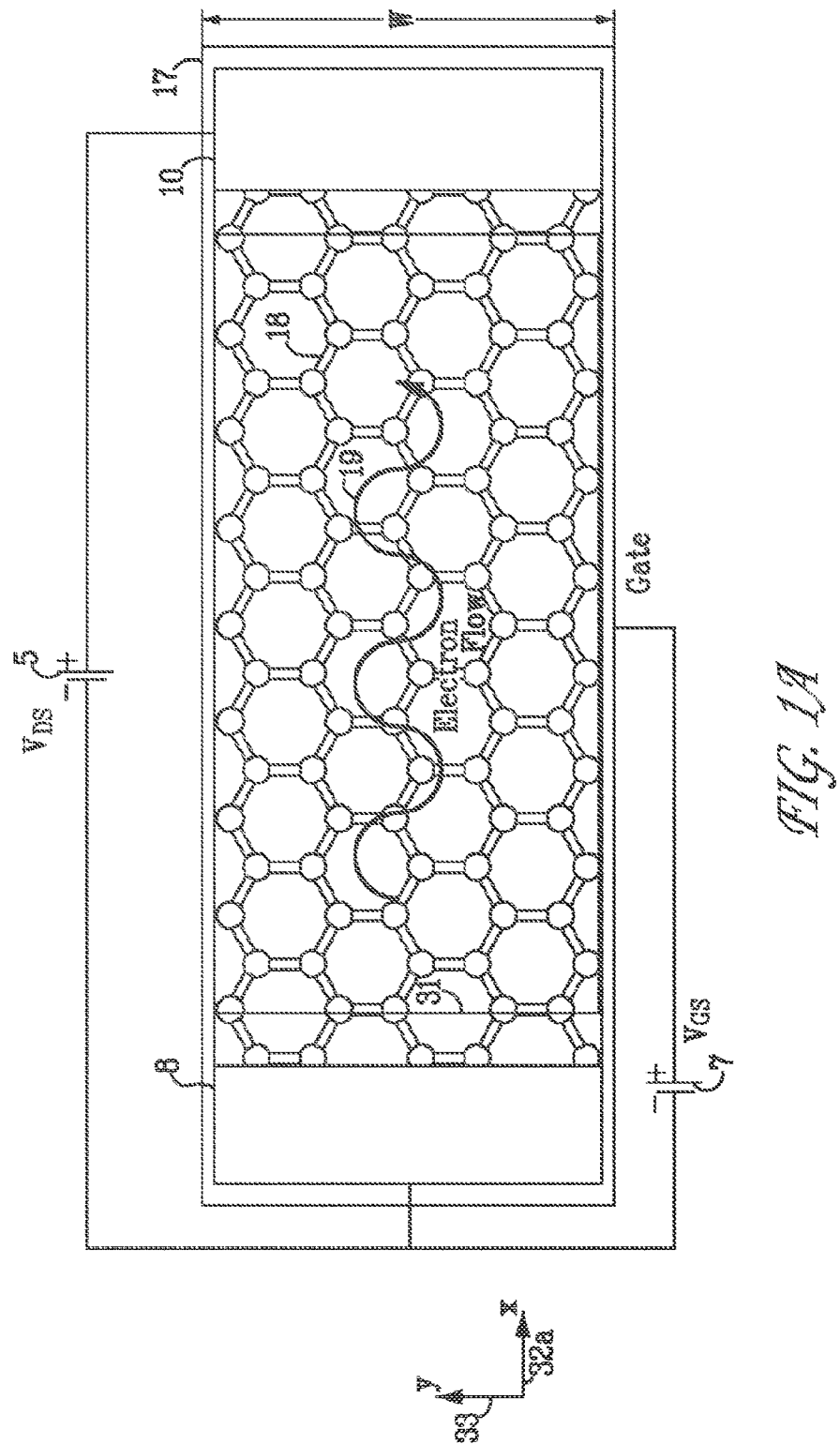
FIG. 1A depicts a top-down view of an embodiment of a solid state device according to the present invention.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges includes each and every value within that range.

Solid state devices according to the present invention are based on graphene and are capable of emitting electromagnetic radiation. These devices comprise, generally, a plurality of layers forming a field effect transistor structure for generating a field-effect n-doping or p-doping in the graphene layer. The layers comprising, in general, a gate layer capable of controlling electron density in one or more upper layers, a first dielectric layer disposed adjacent to the gate layer, and the graphene layer disposed adjacent to the at least one first dielectric layer. A source disposed adjacent to, and in electrical communication with, the graphene layer is also provided, as well as a drain disposed adjacent to, and in electrical communication with, the graphene layer. The source and the drain are typically disposed at distal ends of the graphene layer, wherein application of an electromotive force (i.e., EMF or electric potential source) between the source and drain gives rise to an electrical current in the graphene layer. The EMF or electric potential source can be an AC source, a DC source, a continuous source, a pulsed source, or any combination thereof.

An alternating magnetic field source is also disposed proximate to the at least one graphene layer, wherein operation of the alternating magnetic field source gives rise to an alternating magnetic field oriented substantially perpendicular to the graphene layer. The alternating magnetic field is capable of being operatively coupled to the electrical current to give rise the electromagnetic radiation produced from the graphene layer. An embodiment of such a solid state device is provided in FIG. 1, the details of which are provided below.

The gate layer, in certain embodiments, is capable of reflecting the electromagnetic radiation produced in the graphene layer disposed proximate to the gate layer. As well, the gate layer may comprise one or more of the following materials that are not necessarily reflective: doped semiconductors, doped Si, conductive polymers. ITO, transparent conductive polymers, and graphene. When the gate layer is capable of reflecting the electromagnetic radiation, the gate layer may comprise one or more of the following materials: conductive polymers, and one or more metallic elements such Ag, Al, Au, Be, Cu, Co, Cr, Fe, In, Mg, Mn, Mo, Ni, Pb, Pd, Pt, Sn, Ti, W, and Zn.

The solid state devices may further comprise a substrate layer, wherein the gate layer is disposed on the substrate layer. Suitable substrate layers may comprise one or more of the following materials: plastic, polymer, metallized polymer, foil, or metals such as Al, Ag, Au, Cu, and the like. In addition, the solid state devices may further comprise a first dielectric layer, wherein at least one or more dielectric layers are disposed on the gate layer. In this case, suitable first dielectric layers may comprise one or more of the following materials: polymer dielectrics, inorganic insulators, electrolytes, $SiO_2$, AlN, BN, ZnO, $Al_2O_3$, HfO, $ZrO_2$, diamond films, sapphire, quartz, glass and SiC.

Suitable alternating magnetic field sources may comprise one or more of the following: a Halback array, permanent magnets assembled in a collection with alternating field polarity, series of parallel wires with current flowing in alternating directions, electromagnets arranged in a collection with alternating field polarity, a magnetic film that has been permanently magnetized with arrays of alternating field domains using an external magnetizing device (like a hard disk read/write head), a magnetizable metal (ferromagnetic) that has been permanently magnetized with arrays of alternating field domains using an external magnetizing device (like a hard disk read/write head), a multilayer film deposited with a anti-ferromagnetic pinning (exchange bias) layer that alternates magnetic polarity on top of a ferromagnetic metal (similar to parts of a spin valve detector), an array of beams of polarized light, an array of beams of polarized laser light with alternating B-field polarity, and periodic structures of dilute magnetic semiconductors arranged with alternate polarity.

Suitable alternating magnetic field sources are capable of alternating over a length or period in the range of from many meters to nanometers depending on the alternating magnetic source used, which when used in accordance with the methods and devices herein can give rise to the generation of EM frequencies in the range of 1 MHz to 99 THz. Useful frequency ranges include but not limited to radio emission in the 10 MHz to 1000 MHz range, HF RFID tags 13.65 MHz to 928 MHz, microwave emissions in the 1 GHz to 170 GHz (bands L, S, C, X, Ku, K, Ka, Q, U, V, E, W, F, & D), terahertz frequency range from 1 THz to 3 THz used in medical imaging, security, and scientific imaging, and far-infrared frequency range from 300 GHz to 30 THz.

For example, a 6.28 meter long EM emitter yielding a period of 1.57 meters can be devised, which gives rise to a 4 MHz frequency output at the mid-range carrier velocity ($6*10^7$ cm/s) in graphene. It could be lower (630 kHz) if the carrier velocity is low due to high impurity scattering. The top end is limited by the smallest useful magnetic grain boundary size that can be made next to a magnetic grain with the opposite magnetic polarity. I could envision making the smallest undulator using Atomic Layer Deposition (ALD), MBE, sputtering, or MOCVD using alternating pinning layers of an anti-ferromagnetic material (like FeMn, NiMn, IrMn, PtMn, RuRhMn, PtPdMn, NiO, and $\alpha$-$Fe_2O_2$ with NiMn having the best room temperature magnetization) deposited onto a ferromagnetic material (like NiFe, Co, FeCo). These film magnetic alloys have a magnetic field strength that ranges from 10,000 Gauss for Ni—Fe, 13-16 kGauss for Co-TM, to 20 kGauss for FeTaN or FeAlN. As the alternating magnetic field domains get smaller, the field strength will may decrease as well so there will be a trade-off between high frequency output and output power. Suitable alternating magnetic field sources are capable of providing a magnetic field strength in the range of from 60,000 Gauss for large permanent magnets, 1,500 Gauss for small NdFeB permanent magnets, to 10,000 Gauss for Ni—Fe alloys. A number of permanent magnets are commercially available from K&J Magnetics (http://www.kimagnetics.com/).

At a 1 µm magnet domain size, the period would be about 4 µm for a Halback configuration, or about 2 µm for a straight alternating N-S S-N configuration. This leads to an output frequency of between 1.57 THz to 3 THz. A 400 nm thick layer of NiO having domains of about 15-20 nm before annealing and about 180 nm after annealing may also be used. Using this value, alternating magnetic domains having periods of between about 400 and about 800 nm gives rise to an output EM frequency in the range of from about 7.5 THz to about 15 THz. Electron velocities at more than $2.5*10^6$ m/s at carrier densities of less than $10^{10}/cm^2$ can be achieved in graphene. Accordingly, frequencies of about 62 THz can be achieved in devices incorporating such magnetic undulators. To achieve 99 THz, a magnetic undulator period of 90 nm can be used with an electron velocity of $9.02*10^7$ cm/s. Accordingly, suitable devices are capable of emitting electromagnetic radiation in the frequency range of from 4 MHz to 99 THz.

The solid state devices are capable of emitting electromagnetic radiation in the frequency range of from but not limited to 10 MHz to 1000 MHz for generating EM waves (i.e., radio emission) for a variety of uses. For example, 13.65 MHz to 928 MHz can be used for HF RFID tags, 1 GHz to 170 GHz (bands L, S, C, X, Ku, K, Ka, Q, U, V, E, W, F, & D) can be used for microwave, 1 THz to 3 THz can be used for medical imaging, security, communications, and scientific imaging, and 300 GHz to 30 THz can be used for generating far-infrared EM frequencies. It should be appreciated that alternating magnetic field sources can be generated by varying a magnetic field spatially, temporally, or any combination thereof.

A suitable alternating magnetic field source that varies the magnetic field spatially may comprise an array of Neodymium Iron Boron permanent magnets measuring 0.125× 0.125×1.0 inches that are mechanically mounted and arranged with alternate magnetic poles or in a Halback configuration to form a 4×4 inch area with a magnetic period of between 0.6 to 1.3 cm producing a 1500 to 3000 Gauss magnetic field perpendicular to the graphene layer, a magnetic array in a magnetic film by ALD, MBE, MOCVD, or sputtering deposition with ferromagnetic materials like NiFe, Co, FeCo and containing alternating field domains incorporated during deposition or as a result of an external writing process from a read/write head yielding a magnetic field strength of 10,000 to 20,000 Gauss with alternating field domains to 180 nm, and a magnetic array in a magnetic film by ALD, MBE, MOCVD, or sputtering deposition with materials like NiFe. Co, FeCo and containing alternating field domains produced by anti-ferromagnetic materials like FeMn, NiMn, IrMn, PtMn, RuRhMn, PtPdMn, NiO, and $\alpha$-$Fe_2O_2$ to create magnetic pinning of magnetic domains by exchange coupling or exchange bias to form magnetic domains down to 400 nm. Various magnetic undulators and wigglers known in the art may also be incorporated. For example, magnetic exchange bias pinning used in GMR sensors, and spin valve sensors may be suitably incorporated in the solid state devices described herein.

A suitable graphene layer is characterized as being a single layer thick of sp2-bonded carbon atoms. The graphene layer may comprise one or more layers of $sp^2$-bonded carbon atoms. In some embodiments, the graphene layer is characterized as having multiple layers of bonded carbon atoms. In this regard, the number of layers of bonded carbon atoms is in the range of from one for a single layer graphene device, to 2 to tens of thousands for multilayer devices. Each graphene layer is one atom thick and layers are typically spaced 0.34 nm apart in multilayer graphene, or may be spaced farther apart by including an insulating material between each graphene layer to form a graphene-dielectric superlattice. The dielectric layers thickness may range from 1 nm to hundreds of nm using deposition techniques, or to centimeters if glass slides or quartz substrates are used, as presently known in the art. The thickness of graphene can be estimated using the Brenner Potential method. The thickness ranges from 0.0574 nm to 0.0811 nm depending on the strain on a suspended graphene sheet. Multilayer graphene may be fabricated and the layers naturally space 0.34 nm apart due to weak van de Waal forces between the graphene layers.

Suitable graphene layers may also comprise one or more dopants. Suitable dopants include one or more of the following: organic materials, organic polymers, pigments, quantum dots, phosphorescent molecules, photoluminescent molecules, semiconductors, carbon nanotubes, fullerenes, elements, molecules, metals, ferromagnetic nanoparticles, and metal nanoparticles. The concentration of the dopant solutions can be in the range of from about 0.01 wt % to 67 wt %. For example, gold nanoparticles can be used in the range of from preferably about 0.1 wt % to about 0.5 w % in toluene, and more generally less than 2 wt % for increased n-type doping in graphene. Graphene becomes antiferromagnetic when doped with Mn densities of 3% to 5%. The conductivity of one and two layer graphene can be reduced by 77% by doping with gold nanoparticles using 10 mM concentrations of $AuCl_3$ in nitromethane during fabrication. More typical dopant solution concentrations are in the range of from about 0.1 wt % to about 2 wt %.

A suitable graphene layer can be characterized as having one or more linear dimensions other than its thickness in the ranges from about 1, 2, 3, 4, 5, 6, and 8 inches in diameter on $SiO_2$ or quartz wafers, on glass wafers dimension ranges from 10×10 mm, 20×20 mm, 100×100 mm, and 2-8 inches, 2 inches in diameter on standard SiC wafers, from 1 inch square to 4.5 inches square for $Al_2O_3$ substrates, 1.9 inches square to 6 inches square for AlN substrates, 30 inches wide by 200 feet long on CVD roll-to-roll processing equipment, and 1 µm to 97 cm for multiple devices in parallel. Roll-to-roll CVD process machines are generally 30 inches wide with graphene being grown on Cu foil and then transferred to a dielectric substrate. The graphene can be transferred to 130 µm thick polyethylene terephthalate films. The Nimrod Hall Copper Foil Company commercially supplies rolls of copper foil which can be used (www.nimrodhall.com).

Suitable electric field strength across the graphene layer needed to generate the maximum electron drift velocity will depend on the electron mobility. The higher the mobility the lower the electric field strength required. A low electric field strength is desirable to minimize the power density in the device and is achieved with a short channel length. Without being bound or limited by any theory, proposed or mechanism, it is believed that the minimum electric field to generate electrons at a drift velocity of about $3.9*10^7$ cm/s is about 5 kV/cm (0.5 V/µm) for an estimated mobility of 7800 $cm^2$/Vs. The range of low field mobility can be in the range of from 200 $cm^2$/Vs for a 1-10 nm graphene ribbon to $10^6$ cm$^2$/Vs for suspended graphene. A maximum drift velocity in graphene can be about $9.03*10^7$ cm/s at a $1.67*10^{12}$/cm$^2$ carrier density using a mobility of at least 40,000 cm$^2$/Vs.

The table below shows a range of graphene layer lengths for embodiments using a 20,000 V drain-source voltage ($V_{DS}$). This high $V_{DS}$ allows for a long device as envisioned with the embodiment described further below in FIG. 8 using a high electron mobility.

| Mobility (cm$^2$/Vs) | Field Strength (V/cm) | Length |
|---|---|---|
| 1,000,000 | 206 | 97.1 cm |
| 40,000 | 5,148 | 3.9 cm |
| 10,000 | 20,592 | 1.0 cm |
| 5000 | 41,187 | 0.5 cm |
| 1000 | 205,929 | 0.1 cm |
| 200 | 1,029,9647 | 0.02 cm |

The table below is generated using a 100 V drain-source voltage. For small channel length (i.e., short graphene layer length) parallel devices can be used to produce higher output powers.

| Mobility (cm$^2$/Vs) | Field Strength (V/cm) | Length |
|---|---|---|
| 1,000,000 | 206 | 4800 μm |
| 40,000 | 5,148 | 190 μm |
| 10,000 | 20,592 | 49 μm |
| 5000 | 41,187 | 24 μm |
| 1000 | 205,929 | 5 μm |
| 200 | 1,029,9647 | 1 μm |

A target mobility of about 83,000 cm$^2$/Vs or greater can be used for the graphene layer, and a 20 kV drain-source ($V_{DS}$) is used to keep the geometry as simple as possible. At lower mobilities, many parallel devices can be fabricated on the substrate. Suitable power supplies are capable of providing up 20 kV at high power, but lower voltage and lower power supplies are preferred. Without being limited by any theory of operation, it is believed that suitable graphene layers are characterized as having an electrical conductivity in the range of from about 30 μS, or even from about 38.7 μS, up to about 1.6 S.

The solid state devices may, optionally, further comprise a second or more dielectric layers disposed on the graphene layer. Such suitable dielectric layers may comprise one or more of the following materials: polymer dielectrics, inorganic insulators, electrolytes, $SiO_2$, AlN, BN, ZnO, $Al_2O_3$, HfO, $ZrO_2$, diamond films, sapphire, quartz, glass, and SiC.

Suitable sources and drains used in the solid state devices may comprise one or more of the following materials: conductive polymers, semiconductors, doped semiconductors, and metals like Ag, Al, Au, Be, Cu, Co, Cr, Fe, In, Mg, Mn, Mo, Ni, Pb, Pd, Pt, Sn, Ti, W, & Zn. A low resistance connection between the drain and source is desired and can be provided using low contact resistance Pt/Au, Al/Au, Ti/Au, Ni/Au, Cu/Au, Pt/Au, and Pd/Au.

Typical applied electromotive forces are in the range of from 100 V/cm to about 70 kV/cm. For a small single layer graphene FET-based device, the electromotive force produced by the drain-source voltage ($V_{DS}$) can be described as a ratio of $V_{DS}$ and the drain-source length. The ratio can be written as $F=V_{DS}/L$ with $V_{DS}$ as the drain-source voltage (the EMF source), and L as the length of the channel. A FET with a 100 nm channel length, a 1 V $V_{DS}$, and 0.3 V drop for contact resistance yields an F=70 kV/cm EMF. The maximum drift velocity can be achieved at an EMF of at least 5 kV/cm, hence the mobility can be about 7800 cm$^2$/Vs in one example. Without being bound by any theory of operation, it is believed that the table below shows a range of field strength and the resulting channel length for a 20,000 V drain-source voltage. This table is based on a simple low field relation between carrier velocity and electric field strength.

| Mobility (cm$^2$/Vs) | Field Strength (V/cm) | Length |
|---|---|---|
| 1,000,000 | 206 | 97 cm |
| 40,000 | 5,148 | 3.9 cm |
| 10,000 | 20,592 | 1.0 cm |
| 5000 | 41,186 | 0.5 cm |
| 1000 | 206,929 | 0.1 cm |
| 200 | 1,029,640 | 0.02 cm |

It should be realized that a lower voltage may also produce a high electron velocity, but this can depend on the electron injection velocity of the contacts.

In another example, a 50 foot long graphene FET has a 1524 cm long channel. The maximum $V_{DS}$ is limited by the breakdown voltage of the PET dielectric substrate. A PET film is made by Dupont Tejjn with the trade name of Mylar. It has a breakdown strength of 7 kV/mil or 2.76 MV/cm. This yields a maximum $V_{DS}$ of 35.8 kV for a 130 μm (5.1 mil) thick film. The EMF is selected so that the electron velocity reaches its highest velocity (the Fermi velocity ~$10^8$ cm/s) for the mobility of the graphene deposited. Allowing $V_{DS}$ to be 20,000 V, below the breakdown strength of the Mylar film, and using a mobility of 40,000 cm$^2$/Vs, then the maximum useful length becomes about 4 cm. The FET structure is then repeated many times and connected in parallel. Thermal management of the device is able to handle the resulting current densities for the area of the device.

The electrical current density in the graphene layer can be in the range of from 0 A/cm$^2$ to $\pm 5$-$20*10^8$ A/cm$^2$ for a maximum range for bipolar operation. Without being bound by theory, it is believed that the current or current density is generally dependent on the carrier density and the electron velocity. The electron velocity is believed to be ballistic at low carrier densities and then begins to slow down at high currier density due to phonon scattering with the dielectric substrate. For single layer suspended graphene, the current density is the highest at 5-$20*10^8$ A/cm$^2$ assuming no contact resistance and low temperatures. The table below shows the range of current densities for various mobility values and for an electric field strength of 5171 V/cm where the electron velocity is predicted to be with 10% of the maximum velocity.

| Mobility (cm$^2$/Vs) | Field Strength (V/cm) | Current Density (A/cm) |
|---|---|---|
| 1,000,000 | 5171 | 27 |
| 40,000 | 5171 | 24 |
| 10,000 | 5171 | 12 |
| 5000 | 5171 | 6.7 |
| 1000 | 5171 | 1.4 |
| 200 | 5171 | 0.3 |

The table below shows the range of current densities for various mobility values and for an electric field strength of 100 V/cm where the electron velocity is will be much lower than the maximum drift velocity (as low as $4*10^6$ cm/s).

| Mobility (cm²/Vs) | Field Strength (V/cm) | Current Density (A/cm) |
|---|---|---|
| 1,000,000 | 100 | 19 |
| 40,000 | 100 | 17 |
| 10,000 | 100 | 0.3 |
| 5000 | 100 | 0.13 |
| 1000 | 100 | 0.03 |
| 200 | 100 | 0.006 |

In one embodiment, the solid state device can be operated wherein the electrical current in the graphene layer is in the range of between 0 A/cm² to 27 A/cm² under normal operating conditions per layer for a device fabricated on a 4 inch wafer that measures approximately 8 by 7 cm, and 0 A/cm² to 2.7 A/cm² for a 50 μm long device used in an RFID type application. A 4 inch $SiO_2$ wafer is used and the average channel length is 7.9 cm. The minimum width is 6.9 cm, and $V_{DS}$ is 20,000 V. The EMF is then in the range of from 2582 V/cm to 2.898 V/cm due to the curved contacts on a mostly circular wafer as described in the patent write up. The maximum carrier density is $1.7*10^{12}$/cm² before the velocity begins to limit on $SiO_2$. Mobilities of 10,000-15,000 cm²/Vs are expected on exfoliated graphene on $SiO_2$, with higher values of 40,000-70,000 cm²/Vs being theoretically possible with 200,000 cm²/Vs being possible for samples without impurities. Very narrow Graphene Nanoribbons (GNR) in the 1-10 nm wide range have been measured with a mobility of 200 cm²/Vs, and 14 nm wide GNR have be measured with a mobility of 1,500 cm²/Vs. Using calculations that include acoustic phonon, optical phonon, and surface polar phonon scattering mechanism, a mobility of 947 cm²/Vs is expected for graphene on $SiO_2$ at 300 K. The current density is, thus, going to depend on the mobility of the graphene layer, which depends on how well it is fabricated. For an 8 cm long channel, L, $V_{DS}$ is 20,000 V, and the mobility is at least 82,372 cm²/Vs for the $SiO_2$ wafer example. This leads to a current density of 24.2 Amp/cm. The current density will be constant for devices of various sizes since we are trying to achieve a target carrier velocity, but $V_{DS}$ will vary with the length of the devices. A cheap RFID tag that is 50 μm long, have a low mobility of 5000 cm²/Vs, and a 5 V drain source voltage, would operate with a 2.7 A/cm current density. The power output is about 76 μW/cm², with a power dissipation of 894 μW/cm².

The magnetic field is operatively coupled to the current in the graphene layer. In this regard, the coupling of the alternating magnetic field to the electrical current in the graphene layer is characterized as a magnetic field exerting a force on a charged particle (i.e., electrons in a current) to deflect its nominal direction as a result of the Lorentz force.

Solid state devices of the present invention may further comprise a back mirror disposed proximate to the source. The back mirror can be disposed directly adjacent to one or more of the dielectric layers, wherein at least one of the dielectric layers is disposed directly adjacent to the source and the back mirror. The dielectric layer disposed directly adjacent to the source and the back mirror is typically characterized as having a thickness in the range of from 10 nm to more than 1,000 nanometers. The mirror may be located an integer number of wavelengths of the output frequency from the filter with enough room to fit the length and width of the magnetic field source to create a resonate cavity. Suitable back mirrors are characterized as being composed of one or more of the following materials: conductive polymers, doped semiconductors, and metals like Ag, Al, Au, Be, Cu, Co, Cr, Fe, In, Mg, Mn, Mo, Ni, Pb, Pd, Pt, Sn, Ti, W, & Zn. The mirror is designed to reflect EM radiation having frequencies ranging form about 4 MHz to about 99 or 100 THz. Typical mirrors can be totally reflective at the wavelength of operation. Suitable conductors or metals should be reflective up through optical wavelengths.

Solid state devices of the present invention may further comprise a front filter disposed proximate to the drain. A suitable front filter is disposed directly adjacent to one or more dielectric layers, wherein at least one of the dielectric layers is disposed directly adjacent to the drain and the front filter. The dielectric layer disposed directly adjacent to the drain and the front filter is characterized as having a thickness in the range of from 10 nm to more than 1,000 nanometers, or may be a thickness that provides and integer number a wavelengths spacing between the mirror and filter to for a cavity to create a resonate cavity. The front filter is characterized as being a filter, a multilayer dielectric interference grating, a multilayer interference grating of high and low Z (atomic weight) materials, and a multi-slit aperture or diffraction grating of conductors, made from conductive polymers, and metals. Suitable metals include any metal composed of one or more of the following elements: Ag, Al, Au, Be, Cu, Co, Cr, Fe, In, Mg, Mn, Mo, Ni, Pb, Pd, Pt, Sn, Ti, W, and Zn. The spacing of the grating parameters is typically frequency dependent. The filter and grating structures may have a lowpass, bandpass, or highpass filter shape. Typical solid state total device thickness is in the range of from about 20 nm to about 10 cm.

Accordingly, it will be appreciated that in certain embodiments the solid-state devices capable of emitting electromagnetic radiation can be made of just a few basic elements. For example, one basic element can be graphene disposed in a field effect transistor structure capable of generating an electric current within the graphene when actuated by an electric potential. And a second basic element can be one or more periodic magnetic arrays disposed proximate to the field effect transistor structure, wherein the periodic magnetic array is capable of laterally accelerating the electric current within the graphene to give rise to electromagnetic radiation emitted from the solid-state device. Several examples of such solid state devices are depicted in further detail in the following section.

The Field Effect Transistor structure comprises a source and drain in electrical communication with the graphene. In certain embodiments, the graphene can be disposed directly adjacent between two dielectric layers, wherein one of the dielectric layers is disposed directly adjacent to a gate, wherein at least two of the gate, the drain and the source are capable of being placed between the electric potential. The electric potential in this embodiment refers to the drain-source potential. There is also a potential between the gate and source that controls the type of carriers and the concentration of carriers in the graphene layer. Suitable Field Effect Transistor structures are capable of generating an electric current in the range of from about 0 to about ±27 A/cm. For example, an electric current of 27 A/cm can occur at an EMF of F=5171 V/cm, a current density of $1.67*10^{12}$/cm², and a mobility of 40,000 cm²/Vs as described above. As well, the Field Effect Transistor structure can also have a plurality of layers, one of said layers being the graphene, wherein a source and a drain in electrical contact with distal ends of the graphene give rise to electrical current within the graphene layer.

Figure 1B:
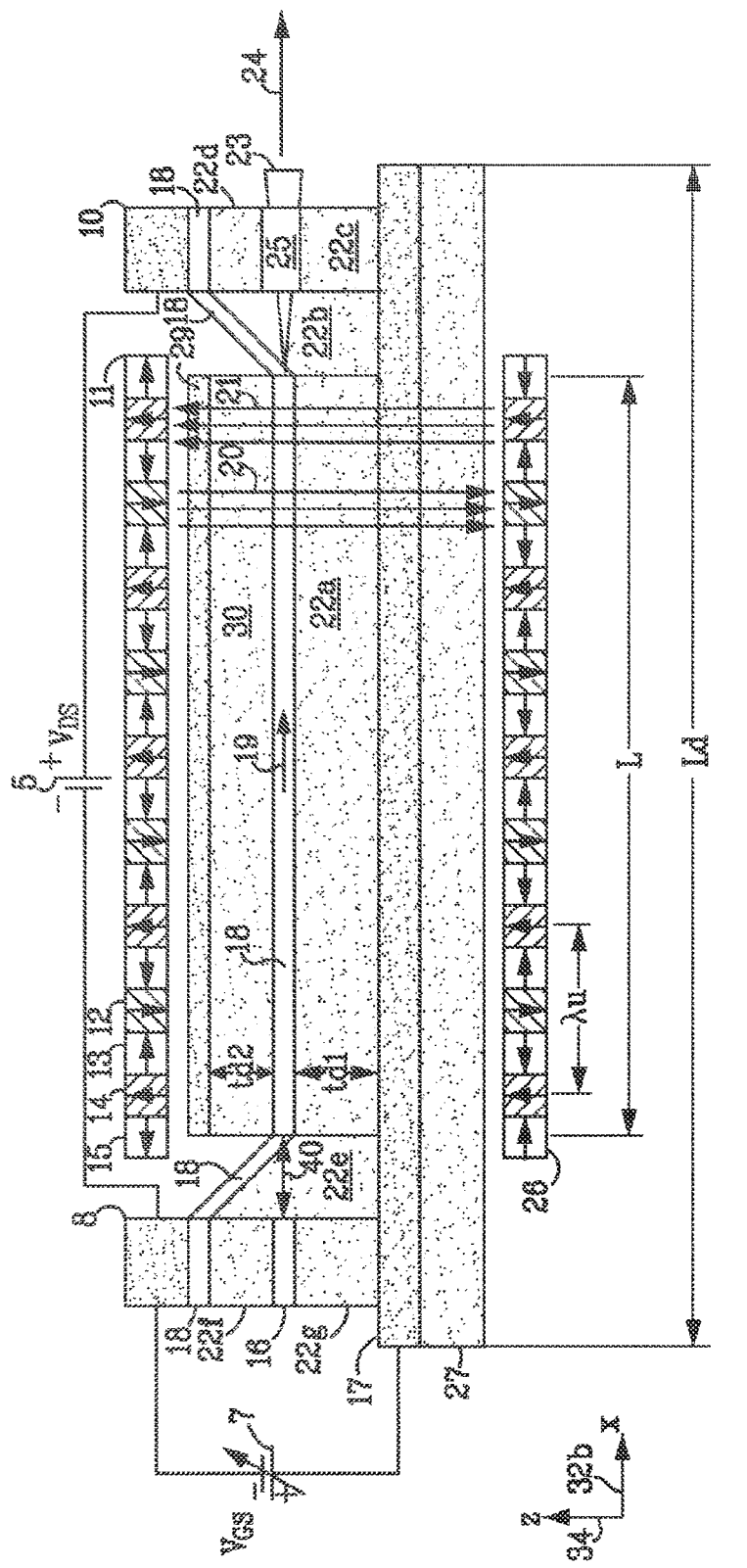
FIG. 1B depicts a cross-sectional side view of the solid state device depicted in FIG. 1A.
Figures 2A, 2B, 3:
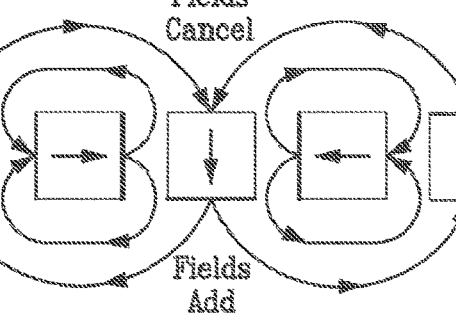
FIG. 2A depicts the Top Undulator Magnetic Field developed from an embodiment of a magnetic array.
FIG. 2B depicts the Bottom Undulator Magnetic Field developed from an embodiment of a magnetic array.
FIG. 3 depicts Undulator Perpendicular Magnetic Fields developed from an embodiment of a magnetic array.
Figure 7B:
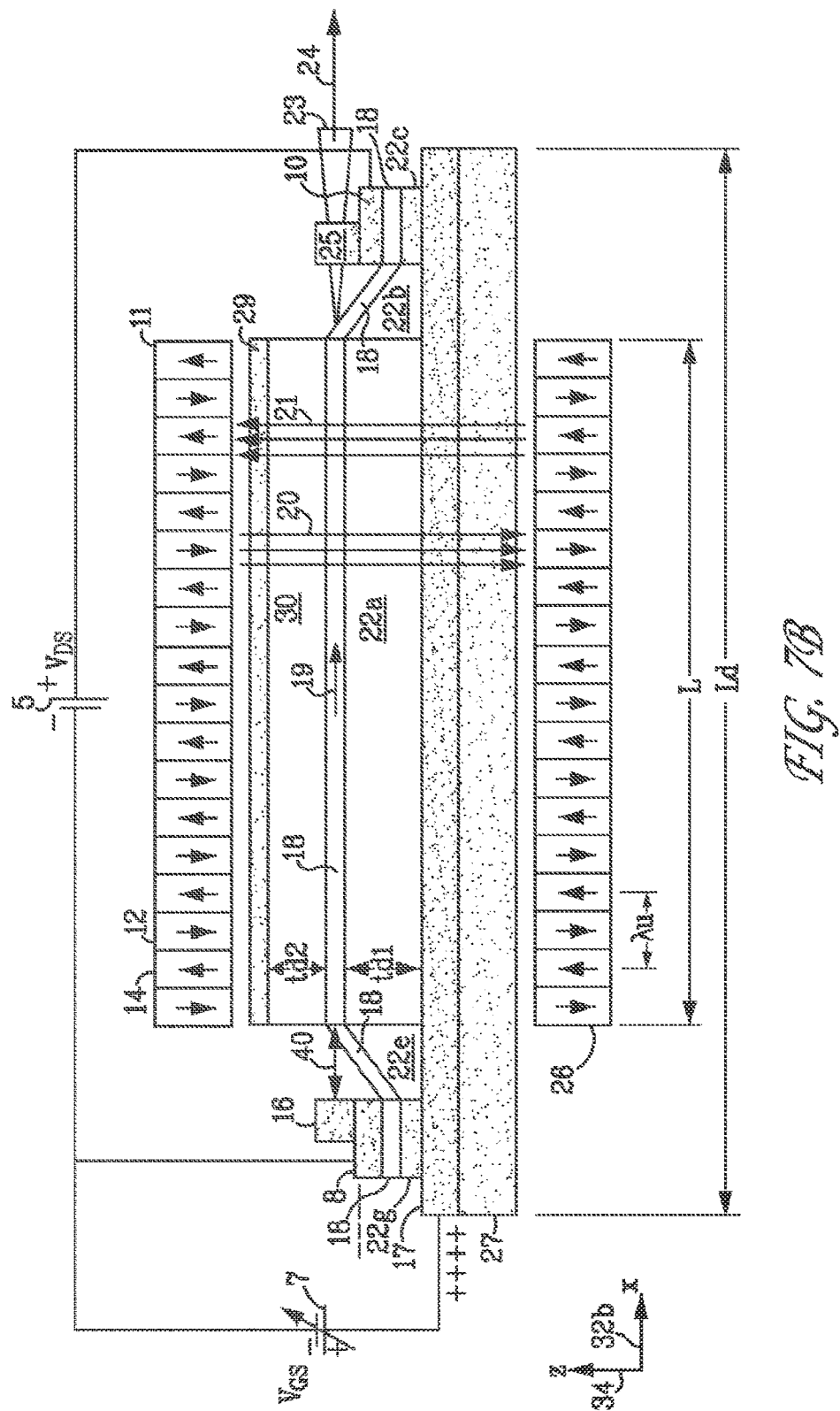
FIG. 7B depicts a cross-sectional side view of the device in FIG. 7A.

Suitable periodic arrays are also provided, for example two periodic magnetic arrays can be disposed externally to the field effect transistor structure. The periodic magnetic arrays may each comprise a plurality of magnets, wherein directly adjacent magnets in each of the two periodic magnetic arrays are characterized as having different magnetic field directions. The periodic magnetic arrays can comprise directly adjacent magnets that are characterized as having different magnetic field directions that vary by about 90 or 180 degrees. A number of different arrangements of the magnets in the periodic magnetic arrays to the Field Effect Transistor structure of the graphene layer are possible, but the Field Effect Transistor structure is typically disposed between two periodic magnetic arrays. For example, the arrangement of the magnets in each of the two periodic magnetic arrays can be the same or different to give rise to lines of magnetic flux passing perpendicular to the electric current and in opposite directions within the graphene layer. Referring to FIGS. 1A and 1B, the top and bottom magnetic arrays are different. For the bottom array shown in FIG. 2B, the field lines cancel out below the magnets and re-enforce above the magnets so the field at the graphene layer is twice as strong. The top magnet array as shown in FIG. 2A is just the opposite so the field re-enforces below the magnets. The magnetic arrays shown in FIG. 7B show an example of magnetic arrays that are the same on the top and the bottom. The lines of magnetic flux passing perpendicular to the electric current and in opposite directions within the graphene are directly adjacent to each other.

It should be appreciated that there are a number different variations of the solid state devices capable of emitting electromagnetic radiation of the present invention. For example, suitable solid state devices can have graphene disposed in a Field Effect Transistor structure and an electric potential source operatively coupled to the graphene to give rise to an electric current within the graphene. A source for generating alternating magnetic flux lines perpendicular and through the graphene is also provided, wherein the alternating magnetic flux lines are capable of laterally accelerating the electrons within the graphene to give rise to electromagnetic radiation emitted from the solid-state device.

Suitable sources for generating alternating magnetic flux lines includes periodic magnetic arrays such as Halback arrays and alternating north and south magnets, each of the magnets disposed to give rise to alternating magnetic fields oriented substantially perpendicular to the graphene.

The solid-state devices may include one or more additional elements, including, for example, EM mirrors, filters, and emitters. An EM mirror can be provided wherein the device comprises two distal ends, one of the two distal ends having a mirror positioned for reflecting electromagnetic radiation generated within the graphene back into the graphene. The other distal end not having the mirror may have a filter for filtering electromagnetic radiation emitted from the graphene. Thus, such solid-state devices can be configured having two distal ends, each of the ends configured to emit electromagnetic radiation external to the field effect transistor structure.

FIG. 12 depicts an embodiment of the solid-state device of the present invention that is capable of emitting electromagnetic radiation that is based on graphene nanoribbons. Accordingly, such devices include a plurality of graphene nanoribbons disposed in a field effect transistor structure, the graphene nanoribbons characterized as curved periodic paths. An electric potential source operatively coupled to each of the graphene nanoribbons is provided to give rise to an electric current in a curved periodic path in each of the graphene nanoribbons. A magnetic field source disposed proximate to the field effect transistor structure is also provided to give rise to a magnetic field passing through the graphene nanoribbons. In this embodiment, the interaction between the electric current in a curved periodic path with the magnetic flux gives rise to electromagnetic radiation emitted from the solid-state device.

Suitable graphene nanoribbons are characterized as having a width (Wr) in the range of from about 1 nm to about 10 cm, or possibly larger. The upper end of the amplitude of the GNR is dependent on the period ($\lambda u$) of the wavelength to be emitted. For example, it was discussed above that graphene having a 1.57 m period and a 10-to-1 aspect ratio for the width to wavelength/2 yields a width of 7.85 cm.

Suitable graphene nanoribbons are also characterized as having a periodicity $\lambda u$ in the range of from about 20 nm to about 7 m. The periodicity is generally determined by the lithography or patterning techniques used to form the graphene nanoribbons. For example, a 1 nm nanoribbon having a 10× aspect ratio has a minimum diameter of 10 nm (half a cycle) and a minimum period of 20 nm. The roll-to-roll example described earlier would have a period of about 6.28 m.

The graphene nanoribbons can each be in electrical communication with a common source, a common drain, or both. Alternatively, the graphene nanoribbons can each be in electrical communication with a separate source, a separate drain, or both. Combinations of common and separate sources and drains are also possible.

Figure 13:
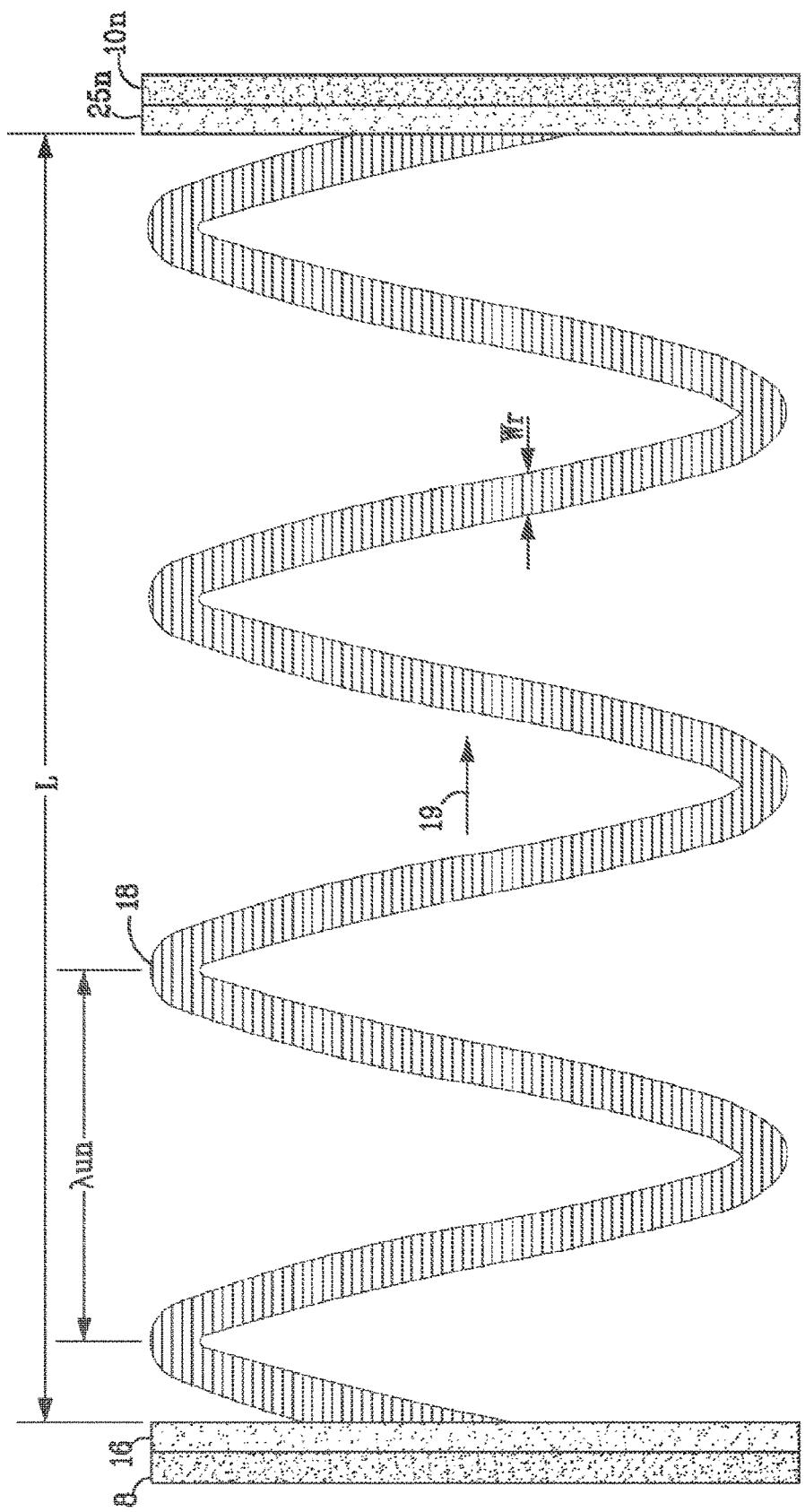
FIG. 13 depicts a top-down view of an embodiment of a solid state device according to the present invention incorporating a Curved Periodic Graphene Path.

Some devices can comprise more than one graphene nanoribbon, possibly two and even up to 10, 100, 1000, 10,000, 100,000, 1 million, 10 million, 100 million, 1 billion, and 2 billion or more nanoribbons. As an example of devices having high numbers of nanoribbons, a 20 nm period and a 10 nm spacing between graphene nanoribbons gives rise to 30 nm/nanoribbon. Such nanoribbons disposed along a 36 inch wide roll (0.914 m) would yield over 30 million nanoribbons across the roll. If the graphene nanoribbons were oriented along the width of a 200 ft roll (61 m), then you could deposit 2.03 billion nanoribbons on the roll. In this regard, a wide range of amplitudes of the curved periodic paths of the graphene nanoribbons are also possible and can be in the range of from about 20 nm to about 1.6 m or even 2 m. The curved periodic paths of the graphene nanoribbons can be generally characterized as oscillating in a single plane, as depicted in FIG. 13. In another variation, as will be described in more detail with respect to FIG. 15 below, the curved periodic paths of the graphene nanoribbons can characterized as a corrugated plane.

Devices according to the present invention comprising a corrugated graphene layer are also provided in various embodiments of the present invention (see below, in connection with FIGS. 14-18.) Accordingly, there is provided a solid-state device capable of emitting electromagnetic radiation, comprising a corrugated graphene layer disposed in a field effect transistor structure. The device further includes an electric potential source operatively coupled to the corrugated graphene layer to give rise to a corrugated electric current within the field effect transistor structure. In addition, a source for generating a magnetic field parallel to the corrugated graphene layer is provided, wherein the electric current passing through the field effect transistor structure in the presence of the magnetic field gives rise to electromagnetic radiation emitted from the solid-state device. As described herein, a suitable electric potential source includes an AC source, a DC source, a continuous source, a pulsed source, or any combination thereof.

Suitable corrugated graphene layers are characterized as having a width in the range of from about 0.34 nm to about 10 cm. A single graphene layer has a thickness of about 0.08 nm. The spacing between graphene layers may range from 0.34 for multilayer graphene without dielectric between them, and 1 nm to 10 cm with a dielectric depending on the dielectric and deposition method. The high end of the thickness may be due to stacking individual wafers or glass slides with a single corrugated graphene layer, for example. The corrugations are typically characterized as having a periodicity $\lambda u$ in the range of from about 2 nm to about 200 μm. The period is typically about twice the smallest feature size. In certain embodiments, two or more corrugated graphene layers, even up to about 3000 corrugated graphene layers, can be used in the solid state devices. For example, a 1 μm thick stack of multilayer graphene has about 2941 layers. The period would need to be long at about 20 μm using a 10-to-1 aspect ratio rule of thumb. In another example, if the period is 2 nm and there is a 2 nm dielectric between layers that is 4 nm/layer. 250 layers could be stacked in a 1 μm superlattice. This case would likely be an ideal case requiring ALD techniques, and a process for depositing graphene in such a system is developed. In such embodiments, it is common, but not required that at least a portion of the corrugated graphene layers are directly adjacent to each other. Alternatively at least a portion of the corrugated graphene layers are spaced apart within the field effect transistor structure. When two or more corrugated graphene layers are provided, they generally are oriented parallel to each other.

The amplitude of the corrugated graphene layers are typically in the range of from about 2 nm to about 1 cm. Corrugated graphene can be provided by first etching corrugations into a dielectric layer, and are thus dependent on lithography or nanoimprinting resolution and the etching process. These processes give rise to amplitudes of the corrugated graphene layers that are in the range of from 1 nm to 100 μm when using common semiconductor process such as lithography. In addition, multilayer graphene layers can be assembled on a flat substrate using a roll-to-roll process, and then this assembly is transferred to a corrugated base structure. The base can also be a sheet magnet with corrugation impressed or etched into it. The period of the structure can be longer than using a full semiconductor fabrication process, but it would be simpler to make because there would be little or no high precision lithography required to make the graphene multilayers. Thus, large solid state device structures could be made this way. Corrugation amplitudes as high as 1 cm permits the use of a reasonable drain-source voltage (~16 kV/cm of linear length for the structure). During operation, the direction of the magnetic field is typically perpendicular to the direction of emitted electromagnetic radiation.

Figure 17:
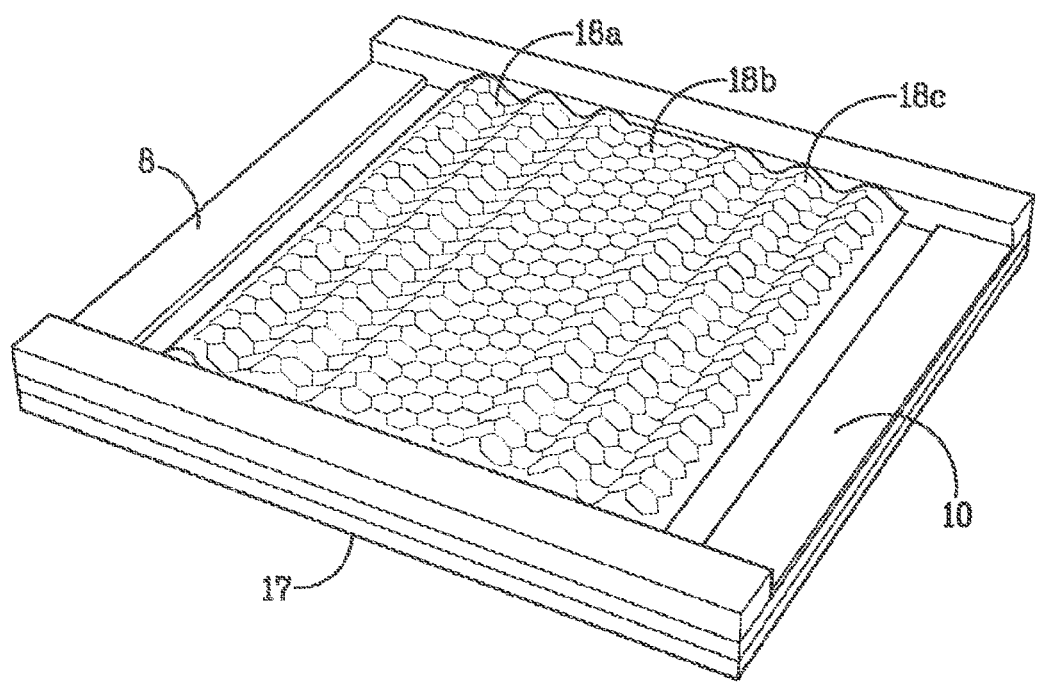
FIG. 17 depicts a perspective view of an embodiment of a solid state device according to the present invention incorporating a Pulsed Output Implementation.

The solid-state device having corrugated graphene with a period $\lambda u$ of the corrugated graphene layer in the range of from about 2 nm to about 1 cm. As an example, FIG. 14 shows an embodiment of a device having a corrugation period $\lambda u$ over nine cycles. The corrugations can be either regular as shown in FIGS. 14 and 15, or irregular as shown in FIG. 17.

Electron accelerators are provided that have, inter alia, an electric potential source operatively coupled to graphene to give rise to an electric current within the graphene. A magnetic field source disposed proximate to the graphene is also provided. A suitable magnetic field source is capable of generating a magnetic field perpendicular to the electric current to give rise to lateral acceleration of the electrons within the graphene. In these embodiments, the graphene can be disposed within a Field Effect Transistor structure and the magnetic field source can be disposed external to the Field Effect Transistor structure. The magnetic field source typically alternates the direction of the magnetic field spatially, temporally, or both. While the magnetic field generated by the magnetic field source is typically directed perpendicular to the direction of the electric current in the graphene, other magnetic field directions may also be advantageous. In certain embodiments, suitable graphene is typically configured in the form of a graphene layer. Hence, in certain embodiments, the magnetic field generated by the magnetic field source is directed perpendicular to the graphene layer. Similar to the various embodiments comprising corrugated graphene as described above, the graphene in the electron accelerator can also be configured in the form of a corrugated layer, so that a magnetic field generated by the magnetic field source can be directed perpendicular to the direction of the electric current in the graphene.

Electromagnetic (EM) radiation can be generated by operating any of the disclosed solid state devices incorporating graphene, and their equivalents. The general method of generating EM radiation, which is not only limited to the devices disclosed herein, includes inducing an electric current in a graphene layer using an electromotive force and accelerating electrons in the graphene layer tangential to the direction of the electromotive force. The electrons are also accelerated within the graphene layer using an alternating magnetic field oriented substantially perpendicular to the graphene layer, wherein the acceleration of the electrons gives rise to electromagnetic radiation. In such embodiments, the direction of the electric current is substantially parallel to the direction of the electromotive force.

Electromagnetic (EM) radiation can also be generated by inducing a current in multiple parallel paths of one or more graphene layers of any of the disclosed solid state devices, and their equivalents. Suitable multiple parallel paths comprise a plurality of graphene nanoribbons. A suitable graphene layer comprises multiple parallel paths using an electromotive force, the direction of current being substantially parallel to the periodic path. Electrons are accelerated in the graphene layer tangential to the direction of the periodic path and within the graphene layer using a constant magnetic field proximate and perpendicular to the graphene layer. Accordingly, acceleration of the electrons gives rise to electromagnetic radiation.

Electrons can also be accelerated in any of a number of the disclosed solid-state devices. For example, a current can be induced in a graphene layer using an electromotive force, the direction of current being substantially parallel to the direction of the electromotive force. Electrons are accelerated in the graphene layer tangential to the direction of the electromotive force and within the graphene layer using an alternating magnetic field proximate and perpendicular to the graphene layer.

Set forth in the following examples and additional illustrative embodiments are methods of making solid state devices capable of emitting electromagnetic radiation. These methods comprise fabricating, buying or otherwise providing a Field Effect Transistor structure comprising a plurality of layers, and disposing an alternating magnetic field source proximate to the field effect transistor structure. The field effect transistor structure typically comprises a plurality of layers. These layers usually include a gate layer and a first dielectric layer disposed adjacent to the gate layer. A graphene layer disposed adjacent to the first dielectric layer, a source disposed adjacent to, and in electrical communication with, the graphene layer are also provided. A drain disposed adjacent to, and in electrical communication with, the graphene layer, wherein the source and the drain are disposed at distal ends of the graphene layer usually completes the basic device.

Examples and Additional Illustrative Embodiments

The following section describes additional details of several embodiments of the disclosed inventions. Several solid state devices capable of emitting Electromagnetic (EM) radiation are based on electron acceleration in graphene are described, some of which devices share characteristics with cyclotron or synchrotron radiation by approximating an electron accelerator containing a magnetic undulator or wiggler. FIGS. 1A & 1B shows one implementation of the device in three dimensions with the top part showing the x-direction 32a and y-direction 33 and the bottom showing the x-direction 32b and z-directions 34. The device has multiple layers to form a Field Effect Transistor (FET) structure. The first layer of the device is a substrate 27 that supports the upper layers. A gate layer 17 is deposited on the substrate 27 and acts to control the electron carrier density in the upper layers and can also act as a reflector for the electromagnetic radiation produced in the graphene 18 layer above it. The gate 17 can be used as the substrate 27 in some implementations. The gate 17 and substrate 27 can be solid or flexible.

A positive voltage 7 between the gate 17 and source 8 produces a large number of electrons in the graphene 18 channel between the source 8 and drain 10. The greater the gate-source voltage 7 that is applied, the greater the number of electrons that are present in the graphene 18 channel that connects the source 8 and drain 10. A dielectric layer 22a-22g is deposited on top of the gate 17 and acts as an electrical insulator between the gate 17, and the graphene 18 layers and the contacts 8 & 10.

Graphene 18 is deposited on top of the insulating layer 22a-22g and acts as a controllable conductive path between the source 8 and drain 10 when a gate voltage 7 is applied. The conductivity of the channel can be increased or decreased by increasing or decreasing the gate-source voltage 7. Graphene 18 is a single layer of carbon atoms that form a hexagon structure. Source 8 and drain 10 contacts at each end of the graphene 18 channel are deposited to provide electrical connections to the graphene 18. The source 8 and drain 10 contacts are deposited on thicker dielectric 22f, 22g, 22d, & 22c so that they do not block or interfere with the radiation emanating from the graphene layer 18. A drain-to-source voltage 5 provides an electro motive force that causes the electrons in the graphene layer to flow 19 between the source 8 and drain 10. Note that conventional current describes the flow of a positively charged carrier between the plus and minus contacts of a battery. The actual electron flow 19 is in the opposite direction.

A back mirror 16 and front filter 25 can be included in the structures under the contacts. The mirror 16 reflects the electromagnetic radiation propagating toward the source, back toward the drain 10 where the EM radiation is emitted 23. This also has the effect of doubling the output power if the spacing between the back mirror and the graphene layer 18 is set so that the reflected EM waves do not interfere destructively with the EM propagating toward the drain 10. The filter 25 can be used to narrow the output bandwidth or select a particular mode of EM radiation, if needed. The size of the back mirror 16 and front filter 25 depends on the wavelength emitted from the graphene layer 18. Graphene 18 was selected as the best candidate conductor because it has relatively high charge carrier velocity compared to other materials. The graphene layer can be doped or deformed to provide higher carrier velocity or higher carrier densities, which might include carbon nanotubes or a super conducting material, for example. The graphene 18 layer can be replaced with other materials that offer better performance (carrier velocity). The graphene layer 18 can be a single layer of graphene, dual layers, or multiple layers separated by air (no dielectric) or by a dielectric.

The dielectric layer 22a-g can be constructed using polymer dielectric, $SiO_2$, AlN, BN, ZnO, $Al_2O_3$, HfO, $ZrO_2$, diamond films, sapphire, quartz, glass, and SiC, for example. Ideal characteristics of the dielectric material selected must include electrical isolation between the gate 17 and graphene 18 layers, low impurities that could interfere with electron transport, low electron-phonon coupling to reduce electron scattering, and transparency to the EM radiation being emitted. The power dissipation of the devices occurs in the graphene layer 18 so it would be advantageous if the dielectric material 22a-g selected also provides high thermal conductivity to conduct heat away from the graphene layer 18. Removing heat via a good thermally conductive path through the dielectric 22a-g, gate 18, and substrate 17 will reduce the electron-phonon scattering that lowers the electron velocity in the graphene layer 18, which is temperature dependent and will yield the highest electron velocity. Higher electron velocities produce higher output power, and higher output frequencies.

A dielectric layer 30 can be optionally added and covers the graphene layer to provide protection from environmental contamination and to raise the average dielectric constant around the graphene layer 18. The higher dielectric constant results in a higher carrier density for the same gate-to-source voltage 7. This dielectric layer 30 can be capped with a metal layer that acts as a reflector to reflect the EM radiation emitted from the graphene layer back toward the center of the device so that the EM radiation propagates out of the device 23 at the drain 10 in a more directional way instead of from all around the top of the graphene layer 18. The thickness of the dielectric layer 22a, td1 is selected for the electrical breakdown strength of the material and the gate-source voltage 7, the dielectric constant, and carrier density desired for a given gate-source voltage 7. A $SiO_2$ wafer, for example, provides the basis for constructing a device with a 300 nm thick dielectric layer 22a that provides an operation to a gate-source voltage 7 under 300 V. The thickness of the optional dielectric layer 30, td2, depends on the EM radiation wavelength being emitted. The thickness td2 is selected so that reflected waves of the metal cap layer 29 do not destructively interfere with the waves being emitted by the graphene. If a metal cap layer 29 is not used, then the thickness td2 can be selected to match td1 to provide a good average dielectric constant around the graphene layer 18.

The alternating magnetic field is produced 20 & 21 by arrays of magnets 11 & 26, or by a magnetic film with periodic field domains written onto the magnetic film located above and below the device. The magnet arrays 11 & 26 can be deposited as part of the fabrication process as a film or can be attached as a separate assembly. The field must be perpendicular to the plane of the graphene 18 to create a force that causes the electrons in the graphene 18 to flow 19 in an oscillatory path with a period equal to the period of the magnet period λu. The two magnetic layers 11 & 26 must align so that the poles from one side to the other line up 20 & 21. The magnetic fields 20 & 21 alternate polarity from north to south, and south to north across the length of the devices (in the x-direction 32a & 32b) with a period of λu.

A magnet has a magnetization direction that is depicted by an arrow showing which way the North Pole of the magnet is pointing. Magnet 15 is pointing to the left, magnet 14 is pointing up, magnet 13 is pointing to the right, and magnet 12 is pointing down. The up and down magnets 14 & 12 provide the perpendicular periodic B-field that drives the electrons in the graphene layer 18 to take on a undulating or oscillatory path 19 in the y-direction 33. Magnets 15 and 13 have a magnetization to the left and right around the up and down magnets 14 & 12. (This configuration is known as the Halback array named after Klaus Halback.) In the top magnet array 11, the magnetic fields of the two horizontal and vertical magnets add on the bottom and cancel on the top as seen in the top part of FIG. 2.

In the bottom magnet array 26 in FIG. 1B, the horizontal and vertical magnetic fields add on the top and cancel on the bottom (see bottom of FIG. 2). The effect is that the magnetic field is twice as strong on the side where the fields add, and zero on the side where they cancel. When the two magnet arrays are aligned on top of each other, the up and down fields align to produce an alternating magnetic field in the z-direction with a period of λu as shown in FIG. 3.

Electrons traveling between the two magnetic arrays in the x-direction are subject to Lorentz force that causes the electrons to follow a sinusoidal-like path in the y-direction 33 (see FIG. 1A). This sinusoidal force subjects the electrons to an acceleration, which causes the electrons to emit EM radiation.

Figure 4:
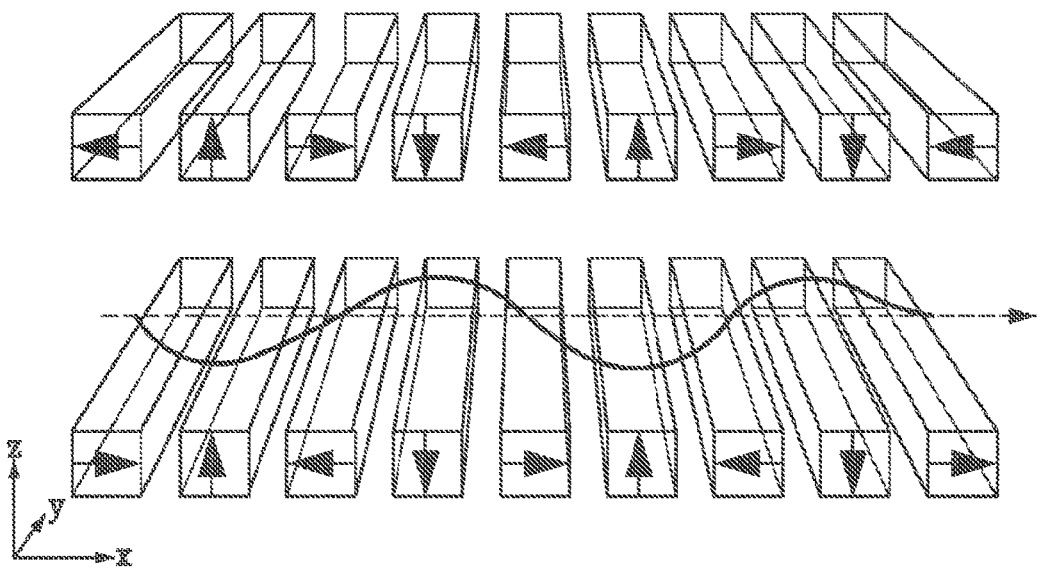
FIG. 4 depicts a 3D Illustration of an embodiment of an array of Undulator Magnets. The arrow illustrates the general current direction.

FIG. 4 shows two Halback magnetic arrays aligned with each other. The individual magnets and arrays are spaced apart to better show the assembly. The arrow with the dotted line shows the electron velocity direction and the wavy dark line shows the electron path that result from the force supplied by the magnets. In a synchrotron, the electrons are supplied by a linear accelerator and traveling at relativistic speeds ($\sim 3*10^{10}$ cm/s) in bunches in air through the undulator assembly. The relativistic electrons produce high energy EM radiation in the x-ray range.

Figure 5:
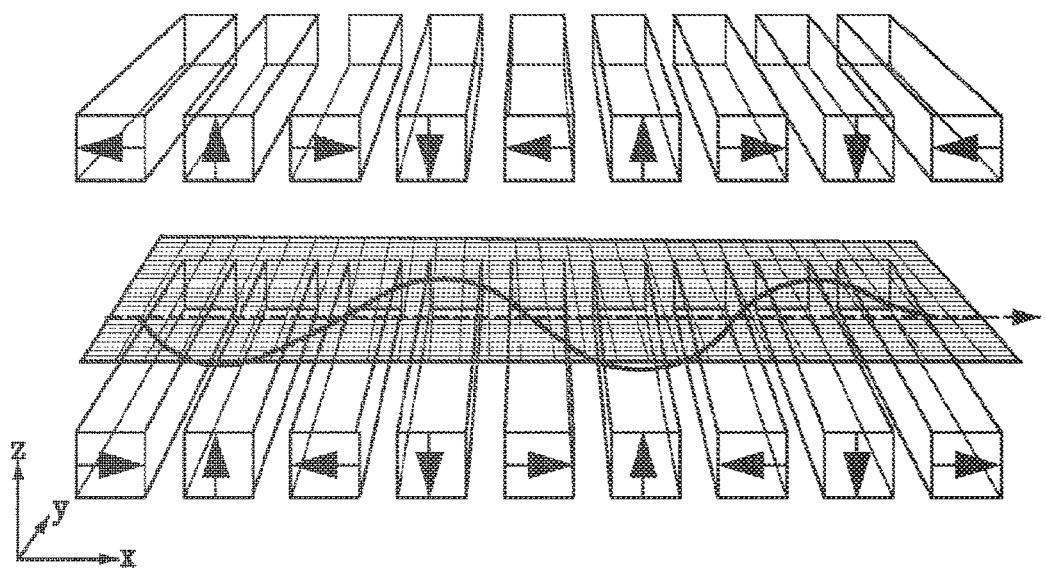
FIG. 5 depicts a 3D Illustration of an embodiment of an array of Undulator Magnets with a Graphene layer disposed therebetween.

In this invention, the electron bunches from the linear accelerator are replaced by electrons carried in a graphene layer 18 that is located between the magnet assembly, as shown conceptually in FIG. 5.

Again the magnets are separated for clarity. The graphene layer 18 is situated so that the plane of the graphene in the x-direction 32a, b is perpendicular to the magnetic field that is in the z-direction 34 and alternates in the x-direction 32a, b. The electrons in the graphene layer 18 are driven (flow) in the x-direction 19 by the drain-source voltage 5. With this geometry, the Lorentz forces on the electrons cause them to deviate back and fourth in the y-direction 33 producing a sinusoidal-like path. The Lorentz force is shown in the equation below in equation (1).

$$F=Q(Ex+Vx \times Bz) \quad (1)$$

Q is the charge of an electron (qe=$-1.6*10^{-19}$ C), Vx is the velocity of the electron in the x-direction, and Bz is the magnetic field in the z-direction. Ex is the electric field in the minus x-direction and is calculated from the geometry of the device as $$Ex = -\frac{Vds}{L} \quad (2)$$

Where Vds is the drain-source voltage 5 and L is the length of the graphene drain-source channel. The electron velocity, Vx, can range from $1*10^7$ cm/s to $9*10^7$ cm/s as a result of typical saturation velocities in graphene that range from $1*10^8$ cm/second and can be as low as $6*10^7$ cm/s. Since Vx and Bz are perpendicular to each other equation (1) simplifies to $$F=Q(Ex+|Vx||Bz|) \quad (3)$$

since the cross product contains the term Sin [90°]=1. The magnetic field is perpendicular to the velocity direction but varies with x as follows $$Bz = Bo\mathrm{Sin}\left[\frac{(2\pi x)}{\lambda \mu}\right] \quad (4)$$

Bo is the nominal strength of the magnet at the up or down location of the magnet array. The sinusoidal path subjects the electrons to an acceleration that can be found by solving F=ma and substituting the force found in equation (3). The result is shown in equation (5) where Me is the effective mass of an electron in graphene, which is carrier density dependent in graphene.

$$a = \frac{Q}{Me}(Ex+|Vx||Bz|) \quad (5)$$

Figure 6:
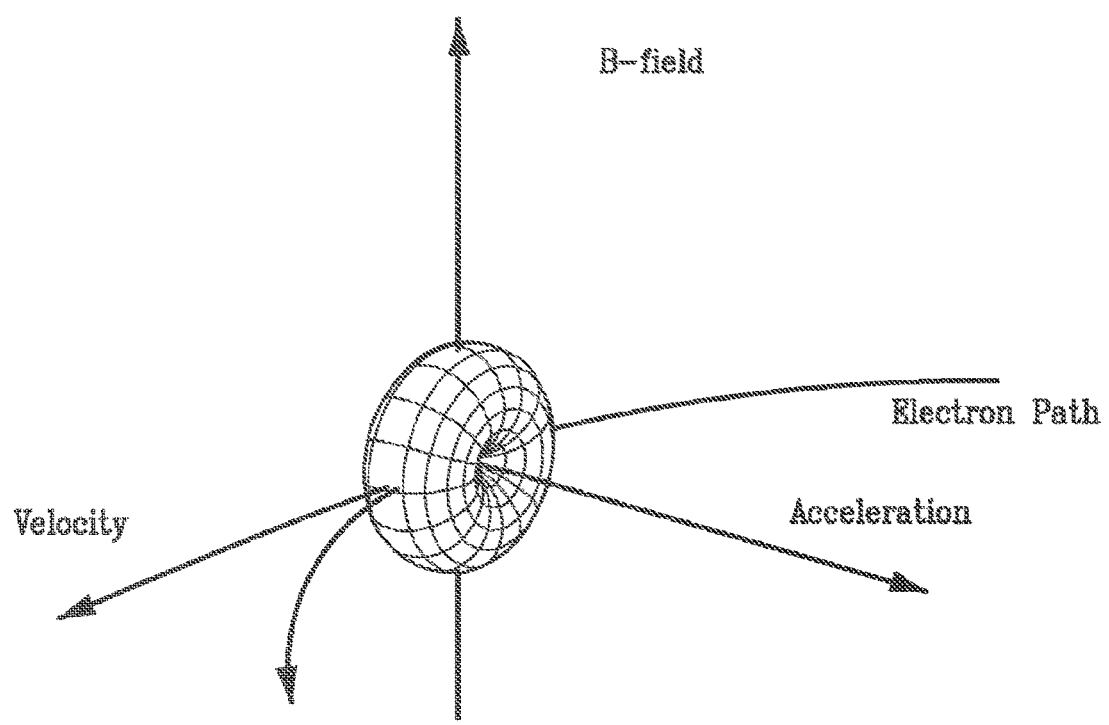
FIG. 6 depicts and Electron Radiation Pattern emanating from an accelerated electron.

An accelerating charge will then emit EM radiation. The acceleration causes distortions in the electric field around the charge. These field distortions are the source of the EM radiation. This acceleration is also perpendicular to the velocity so the radiation pattern has a toroid or donut shape oriented so that the donut hole aligns with the direction of acceleration, as shown in FIG. 6. As the electron flows along the sinusoidal path 19 in the graphene, the radiation pattern looks like a donut or wheel rolling along the sinusoidal path with the donut hole or axel being parallel to the graphene layer.

The total instantaneous power radiated from the electron is computed using the Poynting vector (S=E×H) and integrated around the solid angle of the radiation $$P = \frac{(8\pi)}{3} \frac{(Q^2|a^2|)}{16\pi^2 \epsilon 0 c^3} \quad (6)$$

Where ε0 is the Permittivity of vacuum and c is the speed of light. Total average power is found by averaging over one cycle and found as P/2. The radiated power from a single electron is very small because the acceleration is small due to the non-relativistic electron velocity, but the structure has three key design parameters that allow the production of higher output power.

The first is high electron densities that are controlled by applying higher gate-source voltages 7 to a limit, the second is by increasing the active area of the device (W*L), and third is by increasing the number of graphene layers. The limitation on carrier density occurs because at some point the higher carrier density begins to impede the carrier velocity, which begins to limit the acceleration and dim the output power. In this case, too many electrons are getting in the way of each other, so the electron velocity begins to drop due to increased electron-electron scattering. Electron densities of greater then $10^{12}/cm^2$ have been described in the literature.

The Fermi electron velocity through graphene is determined by the honeycomb geometry of graphene and the π-orbitals of the carbon, and is reported as 1.00337*10⁸ cm/second. The Fermi velocity is the maximum electron velocity in graphene. Electron are scattered by phonons that are present in the dielectric that the graphene is deposited on, 22a-g, & 30, which gives rise to a saturation velocity. The saturation velocity is dependent on the carrier density and phonon energy level in the dielectric, which ranges from 55 meV to 238 eV for SiO₂. The saturation velocity is used to determine the drift velocity, Vx, as shown by equation (7).

$$Vx = \frac{(\mu Ex)}{\left(1 + \left(\frac{(\mu Ex)}{Vsat}\right)^\gamma\right)^{\frac{1}{\gamma}}} \quad (7)$$

Where μ is the mobility of the graphene layer, Ex is the electric field strength, and γ is a fitting parameter that is approximately 2 for electrons in graphene. The peak electron drift velocity, Vx, occurs when with an electric field strength and carrier density that just reaches saturation.

To compute the carrier density, the gate capacitance needs to be calculated. The gate capacitance is determined by the properties of the gate dielectric materials itself (such as SiO₂). The gate dielectric material capacitance is the ratio of the dielectric constant divided by the gate thickness td1.

$$Cg = \frac{\epsilon 0 \kappa}{t} \quad (8)$$

Where ε0 is the Permittivity of vacuum, κ is the relative dielectric constant (3.9 for SiO₂), and t is the gate dielectric thickness td1. The thickness of a typical silicon wafer with a SiO₂ layer is 300 nm. The gate capacitance for a 300 nm SiO₂ layer is 7.23*10⁻⁹ Farads/cm², for example. With the gate capacitance available, the carrier density, n, can be computed.

$$n = \frac{(CgVg)}{Q} + \left(nq\left(1 - \sqrt{\left(1 + \frac{CgVg}{Qnq}\right)}\right)\right) \quad (9)$$

Where Vg is the gate-to-source voltage 7 and nq is the quantum carrier density. The quantum carrier density is a function of the gate capacitance and carrier velocity, but it is in general so small the carrier density is approximated as n=(Cg Vg)/Q.

$$nq = \frac{\pi}{2}\left(\frac{(Cg \hbar Vf)}{Q^2}\right)^2 \quad (10)$$

Where Vf is the Fermi velocity, and h is Planck's constant divided by 2π. The carrier density has been reported to range from 10⁹/cm² to 5*10¹²/cm² in the literature. With the carrier density, the total average output power is power output from one electron times the total number of electrons in the graphene as calculated in equation (11).

$$Pn = \frac{nP}{2} \quad (11)$$

The carrier density is a function of gate voltage 7, so the output power can be controlled by varying the gate voltage. A positive gate voltage 7 produces electrons in the graphene layer 18, and a negative gate voltage 7 produce holes (positive charge) in the graphene layer 18.

The emitted frequency is related to the velocity of the electron divided by the period of the undulator magnet assembly, as shown in equation (12). This frequency, fu, is the fundamental frequency that is radiated.

$$fu = \frac{2\pi Vx}{\lambda u} \quad (12)$$

The analysis presented above describes the continuous and uniform acceleration of a large number of electrons in the graphene to emit EM radiation. This process can be interfered with or enhanced by impurities, defects, or dopants on the graphene 18 or in dielectric layers around the graphene 22a & 30. If the impurities, defects, or dopants interfere with the EM process by slowing down the electrons and thus decreasing the acceleration of the electron reducing the radiated power, then they must be eliminated or minimized.

However, the impurities, defects, or dopants can be used to enhance the EM radiation by increasing or supplementing the acceleration or deceleration of the electrons. If an impurity, defect, or dopant is positively charged or polar in nature, then an electron should experience an additional deflection in its trajectory that results in an acceleration or deceleration of the electron which could result in additional EM radiation emissions, for example. This radiation process is known as Bremsstrahlung or breaking radiation.

The EM radiation characteristics like wavelength, spectrum, or bandwidth can be enhanced by impurities, defects, or dopants through the use of the Forester Radiative Energy Transfer (FRET) process. The energy from the electrons is radiatively coupled to the impurity, defect, or dopant. The impurity, defect, or dopant absorbs this energy and re-radiates the energy at a different wavelength via a phosphorescence process. The electron radiation from the graphene 18 must be emitted in an energy band or frequency that overlaps with the absorption band of the impurity, defect, or dopant. The impurity, defect, or dopant will emit radiation or light at lower energy level than what was absorbed due to losses in the energy transfer process, but the new wavelength or spectrum emitted can be more desirable. The impurities, defects, or dopants must be within 10 nm of the electrons in the graphene layer for this FRET energy transfer to be effective.

The edges of the graphene channel along the length can terminate in a zigzag or armchair pattern. This pattern results in dangling carbon bonds at the edges and these bonds tend to attach to hydrogen atoms. This change in symmetry in the geometry results in complex electron transport and wave-function phenomenon. If the edge effects interfere with the EM radiation emission, then the magnet assembly should be sized so that the edges are not included in the magnetic field (i.e., the active area 31 under the magnets should not include the graphene edges).

If the edge effects offer the advantage of extra acceleration or deceleration and desirable EM emissions, then the edges should be included under the magnet assemblies. Should the edge effects provide significant EM emissions or enhancements, then the graphene layer 18 can be patterned into nanoribbons between a common source and multiple drain contacts with one drain contact per graphene nanoribbon to produce more edge effect based EM radiation.

The EM emissions from the device occur from the use of DC voltages and do not require complex oscillators to produce this EM radiation.

FIGS. 7A & 7B shows a second implementation of the device in three dimensions with the top part showing the x-direction 32a and y-direction 33 and the bottom showing the x-direction 32b and z-directions 34. The device has multiple layers to form a Field Effect Transistor (FET) structure. The first layer of the device is a substrate 27 that supports the upper layers. A gate layer 17 is deposited on the substrate 27 and acts to control the electron carrier density in the upper layer and can also act as a reflector for the electromagnetic radiation produced in the graphene 18 layer above. The gate 17 can be used as the substrate 27 in some implementations. The gate 17 and substrate 27 can be solid or flexible.

A positive voltage 7 between the gate 17 and source 8 produces a large number of electrons in the graphene 18 channel between the source 8 and drain 10. The greater the gate-source voltage 7 that is applied, the greater the number of electrons that are present in the graphene 18 channel that connects the source 8 and drain 10. A dielectric layer 22a-c, e & g is deposited on top of the gate 17 and acts as an electrical insulator between the gate 17 and the graphene 18 layer and contacts 8 & 10.

Graphene 18 is deposited on top of the insulating layer 22a-c, e & g and acts as a controllable conductive path between the source 8 and drain 10 when a gate voltage 7 is applied. The conductivity of the graphene channel can be increased or decreased by increasing or decreasing the gate-source voltage 7. Graphene 18 is a single layer of carbon atoms that form a hexagon structure. Source 8 and drain 10 metal contacts at each end of the graphene 18 channel are deposited to provide electrical connections to the graphene 18. The source 8 and drain 10 contacts are deposited on thinner dielectric 22c & 22g so that they do not block or interfere with the radiation emanating from the graphene layer 18. A drain-to-source voltage 5 provides an electromotive force that causes the electrons in the graphene layer 18 to flow 19 between the source 8 and drain 10 contacts. Note that conventional current describes the flow of a positively charged carrier between the plus and minus contacts of a battery. The actual electron flow 19 is in the opposite direction of the conventional current.

A back mirror 16 and front filter 25 can be included in the structures on top of the contacts. The front mirror 16 reflects 40 the electromagnetic radiation propagating toward the source back toward the drain 10 where the EM radiation is emitted 23. This also has the effect of doubling the output power if the spacing between the mirror and the graphene layer 18 is set so that the reflected EM waves do not interfere destructively with the EM propagating toward the drain 10. The front filter 25 can be used to narrow the output bandwidth or select a particular mode of EM radiation, if needed. The size of the back mirror 16 and front filter 25 depends on the wavelength being emitted by the graphene layer 18. Graphene 18 was selected as the best candidate conductor because it has a relatively high charge carrier velocity compared to other materials. The graphene layer can be doped to provide higher carrier velocity or higher carrier densities. The graphene 18 layer can be replaced with other materials that offer better performance (carrier velocity). The graphene layer 18 can be a single layer of graphene, dual layers or multiple layers separated by air (no dielectric) or by a dielectric.

The dielectric layer 22a-c, e & g can be constructed using polymer dielectrics, inorganic insulators, $SiO_2$, AlN, BN, ZnO, $Al_2O_3$, HfO, $ZrO_2$, diamond films, sapphire, quartz, glass, and SiC, for example. Ideal characteristics of the dielectric material selected must include electrical isolation between the gate 17 and graphene 18 layer, provide low impurities so as not to interfere with electron transport, low electron-phonon coupling to reduce electron scattering, and transparency to the EM radiation being emitted. The power dissipation of the devices occurs in the graphene layer 18 so it would be advantageous if the dielectric material 22a-c, e & g selected also provide high thermal conductivity to conduct heat away from the graphene layer 18. Removing heat via a good thermally conductive path through the dielectric 22a-g, gate 18, and substrate 17 will reduce the electron-phonon scattering that lowers the electron velocity in the graphene layer 18, which is temperature dependent and will yield the highest electron velocity. Higher electron velocities produce higher output power, and higher output frequencies.

A dielectric layer 30 can be optionally added and covers the graphene layer 18 to provide protection from environmental contamination and to raise the average dielectric constant around the graphene layer 18. The higher dielectric constant results in a higher carrier density for the same gate to source voltage 7. This dielectric layer 30 can be capped with a metal layer that acts as a reflector to reflect the EM radiation emitted from the graphene layer back toward the center of the device so that the EM radiation propagates out of the device 23 at the drain 10 in a more directional way instead of from all around the top of the graphene layer 18. The thickness of the dielectric layers 22a-c, e & g is selected for the breakdown strength of the material and the gate-source voltage 7, the dielectric constant, and carrier density desired for a given gate-source voltage 7. A $SiO_2$ wafer, for example, would provide the basis for constructing a device with a 300 nm thick dielectric layer 22a that would provide operation to a gate-source voltage 7 under 300 V. The thickness of the optional dielectric layer 30, td2, depends on the EM radiation wavelength being emitted. The thickness td2 is selected to so that reflected waves of the metal cap layer 29 do not destructively interfere with the waves being emitted by the graphene. If a metal cap layer 29 is not used, then the thickness td2 can be selected to match td1 to provide a good average dielectric constant around the graphene layer 18.

The alternating magnetic field is produced 20 & 21 by arrays of magnets 11 & 26 or by a magnetic film with periodic field domains written onto the magnetic film located above and below the device. The magnets 11 & 26 can be deposited as part of the fabrication process as a film or can be attached as a separate assembly. The field must be perpendicular to the plane of the graphene 18 to create a force that causes the electrons in the graphene 18 to flow 19 in an oscillatory path with a period equal to the period of the magnet period λu. The two magnetic arrays 11 & 26 must align so that the poles from one side to the other line up 20 & 21. The magnetic fields 20 & 21 alternate polarity from north to south, and south to north across the length of the devices (in the x-direction 32a & 32b) with a period of λu.

A magnet has a magnetization direction that is depicted by an arrow showing which way the North Pole of the magnet is pointing. Magnet 14 is pointing up, and magnet 12 is pointing down. The up and down magnets 14 & 12 provide the perpendicular periodic B-field that drives the electrons in the graphene layer 18 to take on a undulating or oscillatory path 19. This configuration is different than the Halback array described previously. This magnet array configuration has the advantage of providing a smaller magnet period but only has the half the magnetic field strength.

FIG. 8 shows a 3D model of a prototype assembly used to test the implementations described above. The bottom magnet holder block 1 is the base of the assembly and is shown with a bottom magnet assembly 4 in the Halback configuration. The magnets in the bottom magnet array 4 are arranged so the magnetic fields are on top. Four half-inch diameter rods 7, 8, 9, & 10 provide alignment between the bottom 1 and top 12 magnet holders. Blocks 2 & 3 acts as spacers between the top 12 and bottom 1 magnet holders, and keep the two magnet holders 1 & 12 apart. The thickness of blocks 2 & 3 can be used to adjust, to select, or to change the spacing between the two magnet holders 1 & 12. In this implementation the spacers 2 & 3 keep the two magnet holders 1 & 12 0.2 inches apart to allow the graphene FET 5 and reflector 6 to sit in between the magnet holders 1 & 12. The top magnet holder contains a magnet array 11. A Halback magnet configuration is shown in the top magnet holder 12 and magnetic fields are oriented to face the bottom of the top magnet holder 12. The graphene FET 5 and reflector 6 are thus situated in a perpendicular periodic magnetic field.

FIG. 9 shows the details of the graphene FET 5 (bottom) and reflector 6 (top) that are shown in the middle of FIG. 8. The graphene FET shown at the bottom FIG. 9 is fabricated on a $SiO_2$ wafer 1 and acts as the dielectric insulator between the gate 17 (not visible in the figure) and the graphene 18, and contact layers 8 & 10. A graphene layer 18 is applied on top of the SiO2 wafer either by a CVD process or transfer process. Note that the patterning shown in the figure is an artifact from the texture tool and is not necessary for this implementation. Metal contacts are deposited on the edges of the wafer and graphene 18 to form the source 8 and drain 10 contacts. A metal gate layer is deposited on the bottom of the wafer to form the gate contact 17 (not visible in this figure).

The top part of FIG. 9 shows the reflector, which can be optionally placed on top of the graphene FET. It is fabricated from a $SiO_2$ dielectric wafer 30. The metal layer 29 is deposited on top of the wafer to act as the reflector. The thickness of the wafer can be adjusted to enhance constructive or destructive interference with the emitted radiation from the graphene layer 18 and the gate 17.

Figure 10:
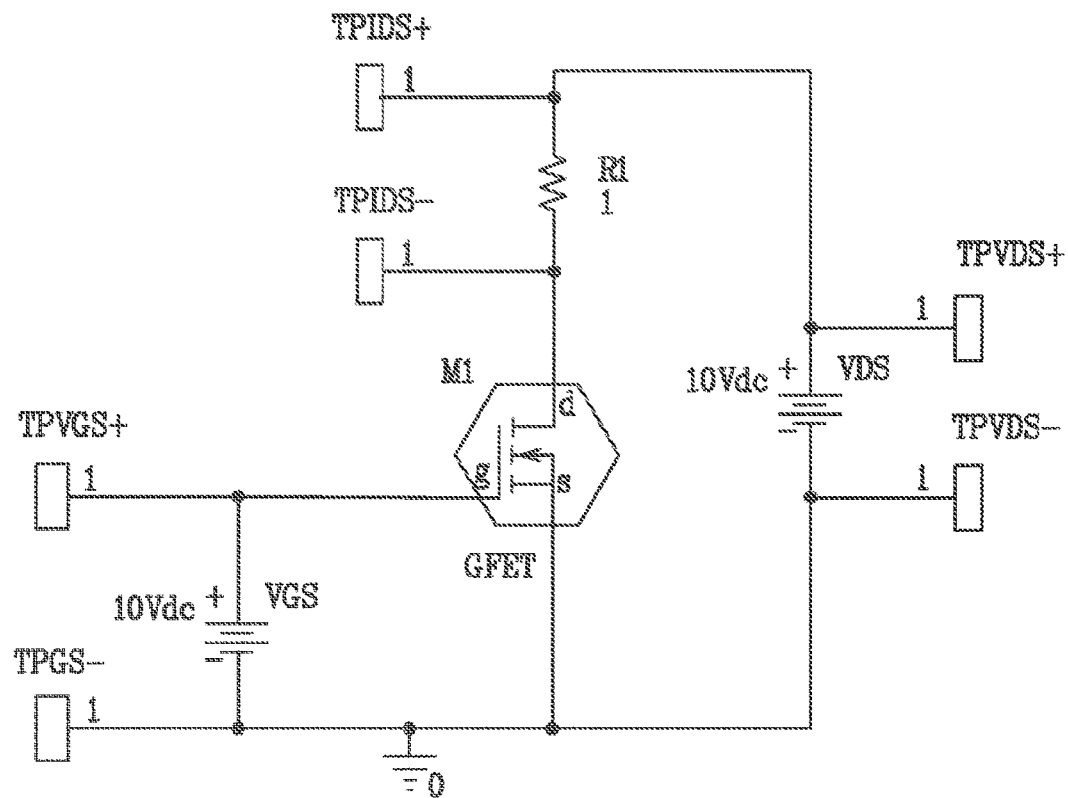
FIG. 10 depicts a schematic circuit diagram for operating a Graphene FET structure according to an embodiment of the present invention.

FIG. 10 shows a schematic of the connections and test points for measuring the DC operation of the graphene FET while situated between the two magnet holders 1 & 12.

The magnet arrays 4 & 11 in the prototype shown in FIG. 8 are constructed using Neodymium Iron Boron (NdFeB) magnets. Each magnet array 4 & 11 contains 140 magnets with the poles oriented to provide a Halback magnet field configuration with a magnetic period, $\lambda u$ of 0.5 inches (1.3 cm). Each magnet measures 0.125×0.125×1.0 inches and produces a magnetic field that ranges from 4000 to 7800 Gauss depending on where it is measured on the surface of the magnet. The magnetic strength between the magnet arrays is estimated from the manufacturer's datasheet to be 1500 Gauss at a 0.2 inch separation (mid point between magnet arrays 4 & 11). A 0.2 inch separation between the magnet arrays should provide about 4.6 mW of output power at 702 MHz. Stronger magnets will produce a stronger output power. FIG. 11 shows the operating and performance parameters for the prototype shown in FIG. 8.

The output frequency can be increased using smaller magnets to provide a shorter $\lambda u$. A magnetic film can be constructed with the alternating domains of North and South magnetization to replace the fixed block magnet-based array. For even higher frequencies, the magnet arrays can be replaced with a laser source where the laser light illuminates the graphene layer 18 with the B-field of the laser light being perpendicular to the plane of the graphene (i.e., the B-field of the laser light is in the z-direction and perpendicular to the electron velocity).

Figure 12A:
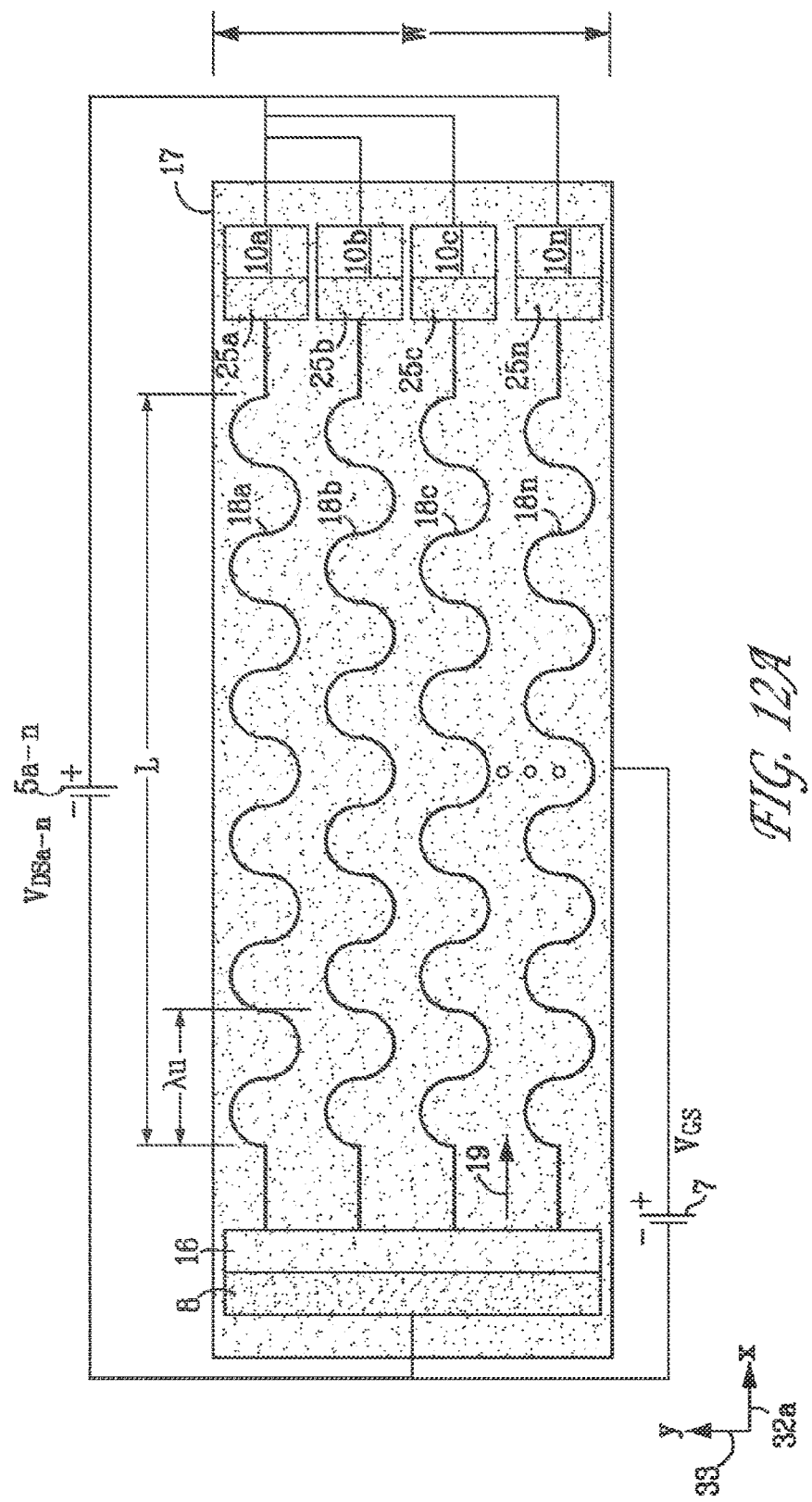
FIG. 12A depicts a top-down view of an embodiment of a solid state device according to the present invention.
Figure 12B:
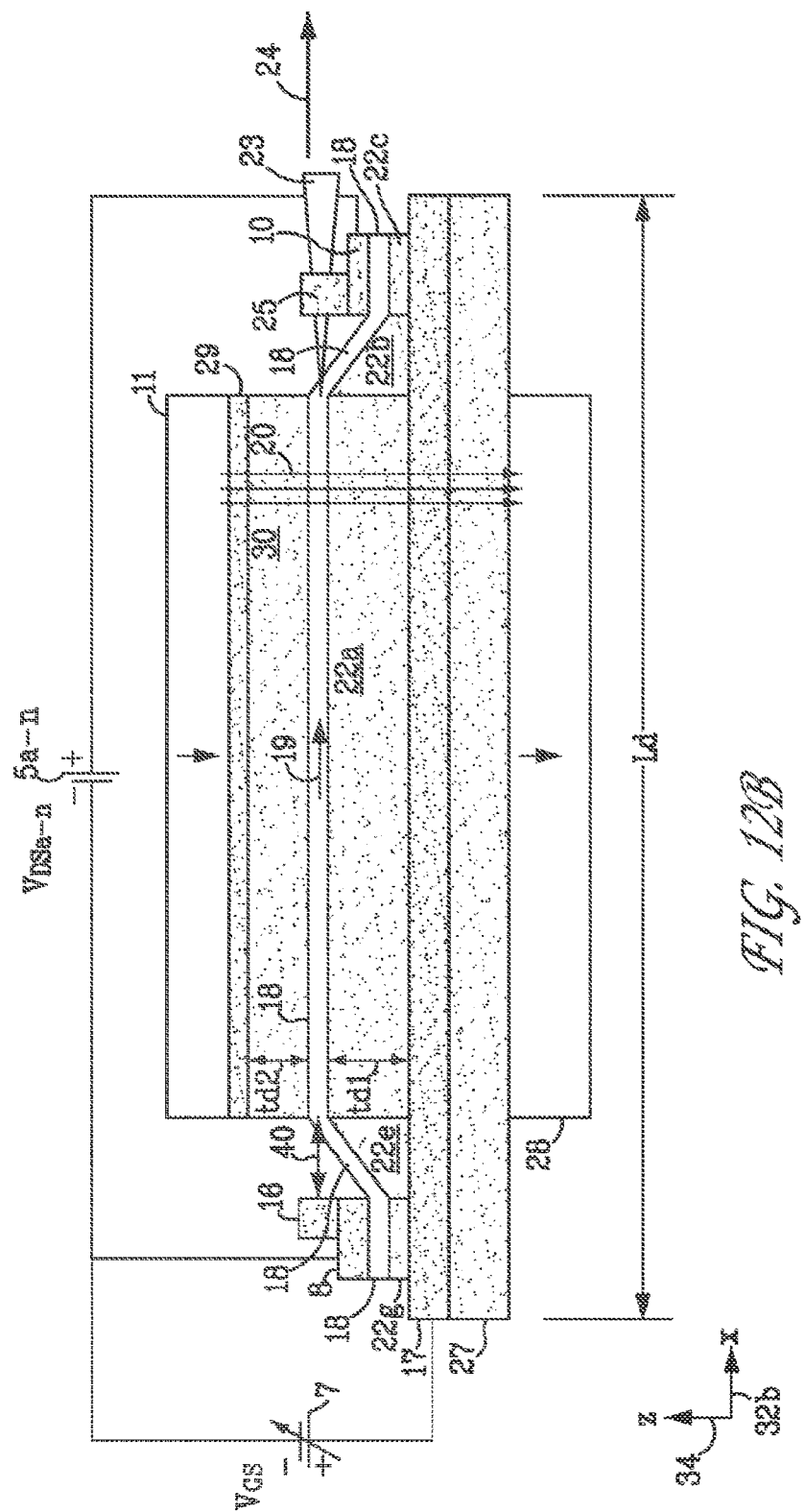
FIG. 12B depicts a cross-sectional side view of the solid state device depicted in FIG. 1A.

FIGS. 12A & 12B shows a third implementation of the synchrotron chip in three dimensions with the top part showing the x-direction 32a and y-direction 33 and the bottom showing the x-direction 32b and z-directions 34. The device has multiple layers to form a Field Effect Transistor (FET) structure. The first layer of the device is a substrate 27 that supports the upper layers. A gate layer 17 is deposited on the substrate 27 and acts to control the electron carrier density in the upper layers and can also act as a reflector for the electromagnetic radiation produced in the graphene 18a-n layer. The gate 17 can be used as the substrate 27 in some implementations. The gate 17 and the substrate 27 layers can be solid or flexible.

A positive voltage 7 between the gate 17 and source 8 produces a large number of electrons in the graphene 18a-n channel between the source 8 and drain 10. The greater the gate-source voltage 7 that is applied, the greater the number of electrons that are present in the graphene 18a-n channel that connects the source 8 and drains 10a-n. A dielectric layer 22a-c, e & g is deposited on top of the gate 17 and acts as an electrical insulator between the gate 17 and the graphene 18a-n layer and contacts 8 & 10a-n.

Graphene 18a-n is deposited on top of the insulating layer 22a-c, e & g and acts as a controllable conductive path between the source 8 and drains 10a-n when a gate voltage 7 is applied. The graphene layer 18a-n is patterned with multiple curved periodic paths between the source 8 and the drains 10a-n. Each path has a common source 8, but separate drains 10a-n so that separate source 8 drain 10a-n voltages 5a-n can be applied. The purpose of the multiple curved periodic graphene paths 18a-n is to produce an acceleration in the x and y-direction 32a, 32b, & 33 to the electron flowing 19 between the source 8 and the drains 10a-n. All the curved graphene paths 18a-n have a period of $\lambda u$ or each path can have a unique period $\lambda ua$-$\lambda un$. FIG. 13 shows one example of one curved periodic graphene path.

Using multiple parallel paths increases the output power of the device. Using different path lengths period $\lambda ua$-$\lambda un$, allows the output radiation pattern to be adjusted using beam forming techniques. Using multiple drains 10a-n allows the current to be adjusted and balanced between all paths by using slightly different gate-drain voltages 5a-n to account for variations in the conductivity of each path. This implementation has the advantage of not requiring periodic magnetic structures or fields, but just a fixed magnetic field structure, assembly, or layer.

The conductivity of the graphene channel can be increased or decreased by increasing or decreasing the gate-source voltage 7. Graphene 18a-n is a single layer of carbon atoms that forms a hexagon structure. Source 8 and drain 10a-n metal contacts at each end of the graphene 18 channel are deposited to provide electrical connections to the graphene paths 18a-n. The source 8 and drain 10a-n contacts are deposited on thinner dielectric 22c & 22g so that they do not block or interfere with the radiation emanating from the graphene layer 18a-n. A drain-to-source voltage 5a-n provides an electromotive force that causes the electrons in the graphene layer 18a-n to flow 19 between the source 8 and drain 10a-n contacts. Note that conventional current describes the flow of a positively charged carrier between the plus and minus contacts of a battery. The actual electron flow 19 is in the opposite direction.

A back mirror 16 and front filters 25a-n can be included in the structures on top of the contacts. The back mirror 16 reflects the electromagnetic radiation propagating toward the source, back toward the drains 10a-n where the EM radiation is emitted 23. This also has the effect of doubling the output power if the spacing between the mirror and the graphene layer 18a-n is set so that the reflected EM waves do not interfere destructively with the EM propagating toward the drains 10a-n. The front filter 25 can be used to narrow the output bandwidth or select a particular mode of EM radiation, if needed. Graphene 18a-n was selected as the best candidate conductor because it has relatively high charge carrier velocity compared to other materials. The graphene layer 18a-n can be doped to provide higher carrier velocity or higher carrier densities. The graphene 18a-n layer can be replaced with other materials that offer better performance (carrier velocity). The graphene layer 18 can be a single layer of graphene, dual layers or multiple layers separated by air (no dielectric) or by a dielectric.

The graphene layer can also be doped with ferromagnetic, paramagnetic, or super paramagnetic materials that can be magnetized in the proper direction (see FIG. 12), or their magnetization aligned with external magnets to produce a stronger local field around the electrons. These dopants should not interfere with the emitted EM radiation or with the velocity of the electrons.

The dielectric layer 22a-c, e & g can be fabricated with polymer dielectrics, inorganic insulators, $SiO_2$, AlN, BN, ZnO, $Al_2O_3$, HfO, $ZrO_2$, diamond films, sapphire, quartz, glass, and SiC, for example. Ideal characteristics of the dielectric material selected must include electrical isolation between the gate 17 and graphene layer 18a-n, provide low impurities so as not to interfere with electron transport, low electron-phonon coupling to reduce electron scattering, and transparency to the EM radiation being emitted. The power dissipation of the devices occurs in the graphene layer 18a-n so it would be advantageous if the dielectric material 22a-c, e & g selected also provide high thermal conductivity to conduct heat away from the graphene layer 18a-n. Removing heat via a good thermally conductive path through the dielectric 22a-c, e, & g, gate 18, and substrate 17 will reduce the electron-phonon scattering that lowers the electron velocity in the graphene layer 18, which is temperature dependent and will yield the highest electron velocity. Higher electron velocities produce higher output power, and higher output frequencies.

A dielectric layer 30 can be optionally added and covers the graphene layer 18a-n to provide protection from environmental contamination and to raise the average dielectric constant around the graphene layer 18a-n. The higher dielectric constant results in a higher carrier density for a given gate-to-source voltage 7. This dielectric layer 30 can be capped with a metal layer that acts as a reflector to reflect the EM radiation emitted from the graphene layer 18a-n back toward the center of the device so that the EM radiation propagates out of the device 23 at the drains 10a-n in a more directional way instead of from all around the top of the graphene layer 18a-n. The thickness of the dielectric layer 22a, td1 is selected for the breakdown strength of the material and the gate-source voltage 7, the dielectric constant, and carrier density desired for a given gate-source voltage 7. A $SiO_2$ wafer, for example, would provide the basis for constructing a device with a 300 nm thick dielectric layer 22a that would provide operation to a gate-source voltage 7 under 300 V. The thickness of the optional dielectric layer 30, td2, depends on the EM radiation wavelength being emitted. The thickness td2 is selected so that reflected waves of the metal cap layer 29 do not destructively interfere with the waves being emitted by the graphene. If a metal cap layer 29 is not used, then the thickness td2 can be selected to match td1 to provide a good average dielectric constant around the graphene layer 18.

The dielectric layers 22a-c, e, g & 30 can also be doped with ferromagnetic, paramagnetic, or super paramagnetic materials that can be magnetized in the proper direction (see FIG. 12), or their magnetization aligned with external magnets to produce a stronger local field around the electrons, which gives rise to a stronger acceleration and output power. These dopants should not interfere with the emitted EM radiation or with the velocity of the electrons.

Each graphene path 18a-n is fabricated to have a sinusoid period that is a function of the x-direction 32a & b with a period λu. This location L[x] describes each point as a 3D vector on the path, as shown in equation (13). Since the path is on the x-y plane, the z-direction is always zero.

$$L[x] = \left\{ x, \, \text{Sin}\left[\frac{(2\pi x)}{\lambda u}\right], \, 0 \right\} \quad (13)$$

The vector notation above has shown the general form of {x, y, z}. In this equation, x is the position in the x-direction and the y-component of the path is described by sine function. An electron must follow this path (sans tunneling) so the velocity vector of the electron will always be pointing in the direction of the path. This direction can be found as function x by computing the unit tangent at x.

The unit tangent is found to be the derivative of L[x] divided by the magnitude of the derivative of L[x] as shown in equation (14).

$$UT[x] = \frac{L'[x]}{\|L'[x]\|} \quad (14)$$

The velocity vector is then the unit tangent times the nominal velocity of an electron on the graphene path. The drift velocity, Vx, of an electron in graphene is found using equation (7) and can be as high as $9*10^7$ cm/Second.

$$v[x] = vxUT[x] \quad (15)$$

The full expanded form of the velocity vector is shown in equation (16) to illustrate the sinusoidal components in the velocity vector.

$$V[x] = \frac{Vx\left\{1, \, \frac{2\pi}{\lambda u}\text{Cos}\left[\frac{2\pi x}{\lambda u}\right], \, 0\right\}}{\left\|\left\{1, \, \frac{2\pi}{\lambda u}\text{Cos}\left[\frac{2\pi x}{\lambda u}\right], \, 0\right\}\right\|} \quad (16)$$

A constant magnetic field is applied that is perpendicular to the sinusoidal path of the electrons and points only in the minus z-direction 34 toward the graphene layer as per the right hand rule (see FIG. 12).

$$B = \{0, 0, -Bo\} \quad (17)$$

A Lorentz force is thus generated due to the electric field, electron velocity, and the static magnetic field in this implementation, and is shown in the equation (18).

$$F = Q(Ee + V \times B) \quad (18)$$

Q is the charge of an electron (qe=−1.6*10⁻¹⁹ C). Ee is the electric field in the minus x-direction 32a & b and is calculated from the geometry of the device as $$Ee = \left\{ -\frac{Vds}{Lu}, 0, 0 \right\} \quad (19)$$

where Vds is the drain-source voltage 5 and Lu is the total length of the drain-source path. The total path length is found in equation (20).

$$Lu = \pi \lambda u Nu \quad (20)$$

Where Nu is the number of path periods in the length L of the graphene paths (see FIG. 12).

$$Nu = \frac{L}{\lambda u} \quad (21)$$

Using F=ma, the acceleration on the electron due to the Lorentz force on the electron is $$a = \frac{Q}{Me}(Ee + V \times B) \quad (22)$$

Where Me is the effective mass of the electron in graphene. This acceleration on the electrons will result in EM radiation emissions. This acceleration is also perpendicular to the velocity so the radiation pattern has a toroid or donut shape oriented so that the donut hole aligns with the direction of acceleration as shown in FIG. 6. As the electron flows along the sinusoidal graphene path 18a-n, the radiation pattern would look like a donut or wheel rolling along the sinusoidal graphene path 18a-n with the donut hole or axel being parallel to the graphene layer.

The total instantaneous power radiated from the electron is computed using the Poynting vector (S=E×H) and integrated around the solid angle of the radiation, as shown in equation (6). Total average power is found by averaging over one cycle and found as P/2. The radiated power from a single electron is very small because the acceleration is small due to the non-relativistic electron velocity, but the structure has three design parameters that allow the production higher output power.

The first is high electron densities that are controlled by applying higher gate-source voltages 7 to a limit, the second is by increasing the active area of the device (W*L) by increasing the number of sinusoidal graphene paths 18a-n, and the third is by increasing the number of layers. The limitation on carrier density occurs because at some point the higher carrier density begins to impede the carrier velocity, which begins to limit the acceleration and dim the output power. In this case, too many electrons are getting in the way of each other so the electron velocity begins to drop due to increased electron-electron scattering. Electron densities of greater than 10¹²/cm² have been described in the literature.

The Fermi electron velocity through graphene is determined by the honeycomb geometry of graphene and the π-orbitals of the carbon, and is reported as 1.00337*10⁸ cm/second. The drift electron velocity is computed as shown in equation (7). Equation (7) yields an electron velocity in the range of 1*10⁷ cm/s to 1*10⁸ cm/s, and this depends on the mobility and the phonon energy levels of the dielectric layer 22a-c, e, g & 30. When the Fermi energy level, which is determined by the carrier density and controlled by the gate voltage, becomes equal or greater than the phonon energy level, then the carrier velocity begins to decrease due to electron-phonon scattering.

The carrier density for the graphene sinusoidal paths is found in equation (9) with the gate capacitance found in equation (8). The carrier (electron) density is a function of the gate-source voltage 7. The carrier density has been reported to range from 10⁹/cm² to 5*10¹²/cm² in the literature. With the carrier density, the total average output power is power output from one electron times the total number of electrons in the graphene as calculated shown in equation (11). Since the carrier density is a function of gate voltage 7, the output power can be controlled by varying the gate voltage.

In this implementation, the velocity vector is sinusoid due to the sinusoidal path and the magnetic field is constant. As a result of the Lorentz forces the, the acceleration becomes periodic as well and has a period of the sinusoidal path. The emitted frequency of the emitted EM radiation is related to the velocity of the electron divided by the period of the sinusoidal path period λu.

$$fu = \frac{2\pi Vx}{\lambda u} \quad (23)$$

The frequency, fu, is no longer limited by the difficulties of creating small powerful periodic magnet assembles to get a high frequency output. The highest output frequency is limited by the smallest sinusoidal path period that can be made, which becomes a limitation of nanolithography so much higher frequencies can be generated.

The analysis presented above describes the continuous and uniform acceleration of a large number of electrons in the graphene to emit EM radiation. This process can be interfered with or enhanced by impurities, defects, or dopants on the graphene 18 or in dielectric layers around the graphene 22a & 30. If the impurities, defects, or dopants would interfere with the EM process by slowing down the electrons and thus decreasing the acceleration of the electron reducing the radiated power, then they must be eliminated or minimized.

However, the impurities, defects, or dopants can be used to enhance the EM radiation by increasing or supplementing the acceleration or deceleration of the electrons. If an impurity, defect, or dopant is positively charged or polar in nature, then an electron should experience an additional deflection in its trajectory that results in an acceleration or deceleration of the electron which could result in additional EM radiation emissions, for example. This radiation process is known as Bremsstrahlung or breaking radiation.

The EM radiation characteristics like wavelength, spectrum, or bandwidth can be enhanced by impurities, defects, or dopants through the use of Forester Radiative Energy Transfer (FRET). The energy from the electrons is radiatively coupled to the impurity, defect, or dopant. The impurity, defect, or dopant absorbs this energy and re-radiates the energy at a different wavelength via a phosphorescence process. The electron radiation from the graphene 18 must be emitted in an energy band or frequency that overlaps with the absorption band of the impurity, defect, or dopant. The impurity, defect, or dopant will emit radiation or light at a lower energy level than what was absorbed due to losses in the energy transfer process, but the wavelength or spectrum of this new radiation can be more desirable. The impurities, defects, or dopants must be within 10 nm of the electrons in the graphene layer for this energy transfer to be effective.

The edges of the graphene channel along the length can terminate in a zigzag or armchair pattern. This pattern results in dangling carbon bonds at the edges and these bonds tend to attach to hydrogen atoms. This change in symmetry in the geometry results in complex electron transport and wave-function phenomenon. If the edge effects interfere with the EM radiation emission, then the width and control of the edge in required to minimize this interference.

The EM emissions from the device occur from the use of DC voltages and do not require complex oscillators to produce this EM radiation.

Figure 14A:
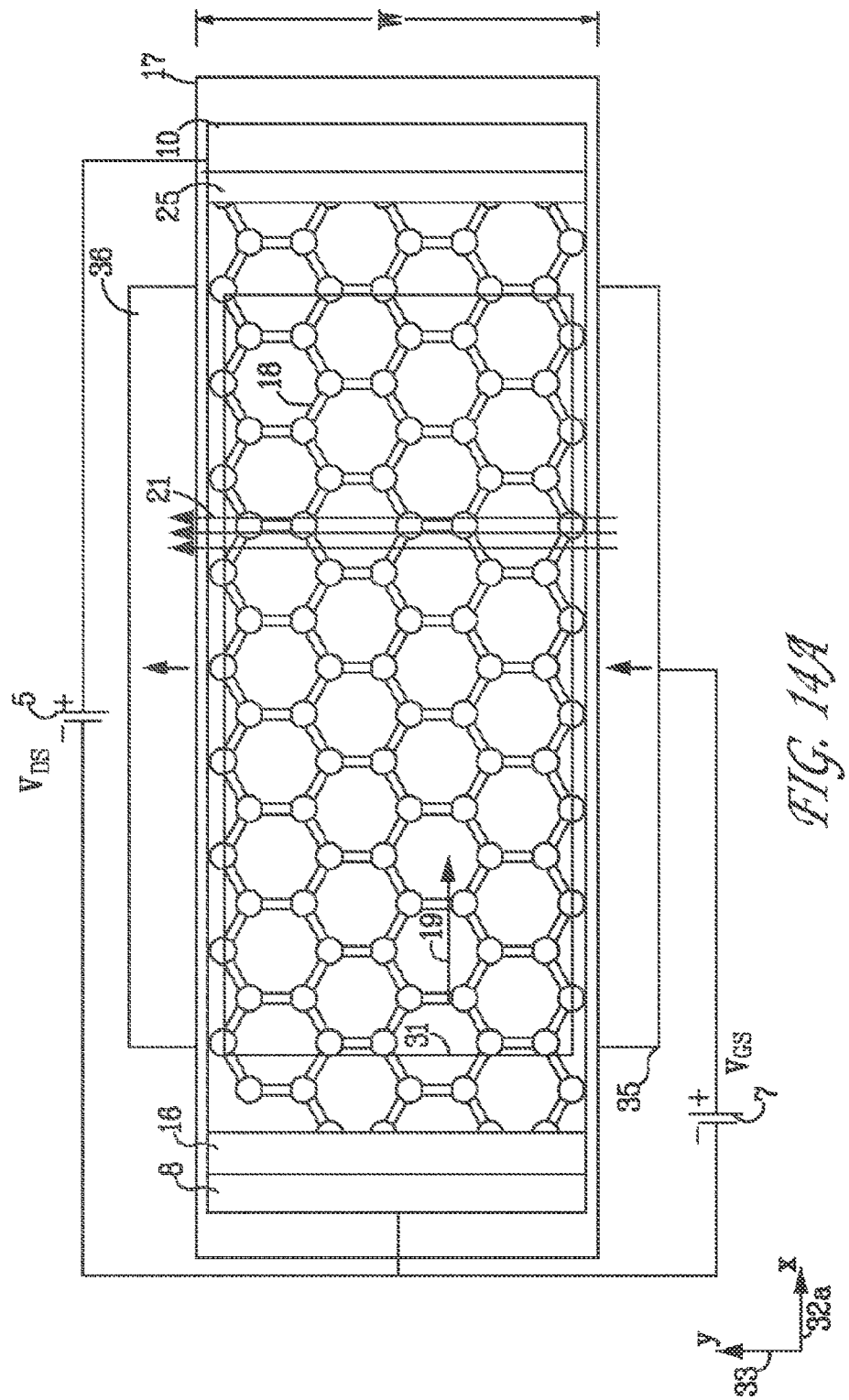
FIG. 14A depicts a top-down view of an embodiment of a solid state device according to the present invention.
Figure 14B:
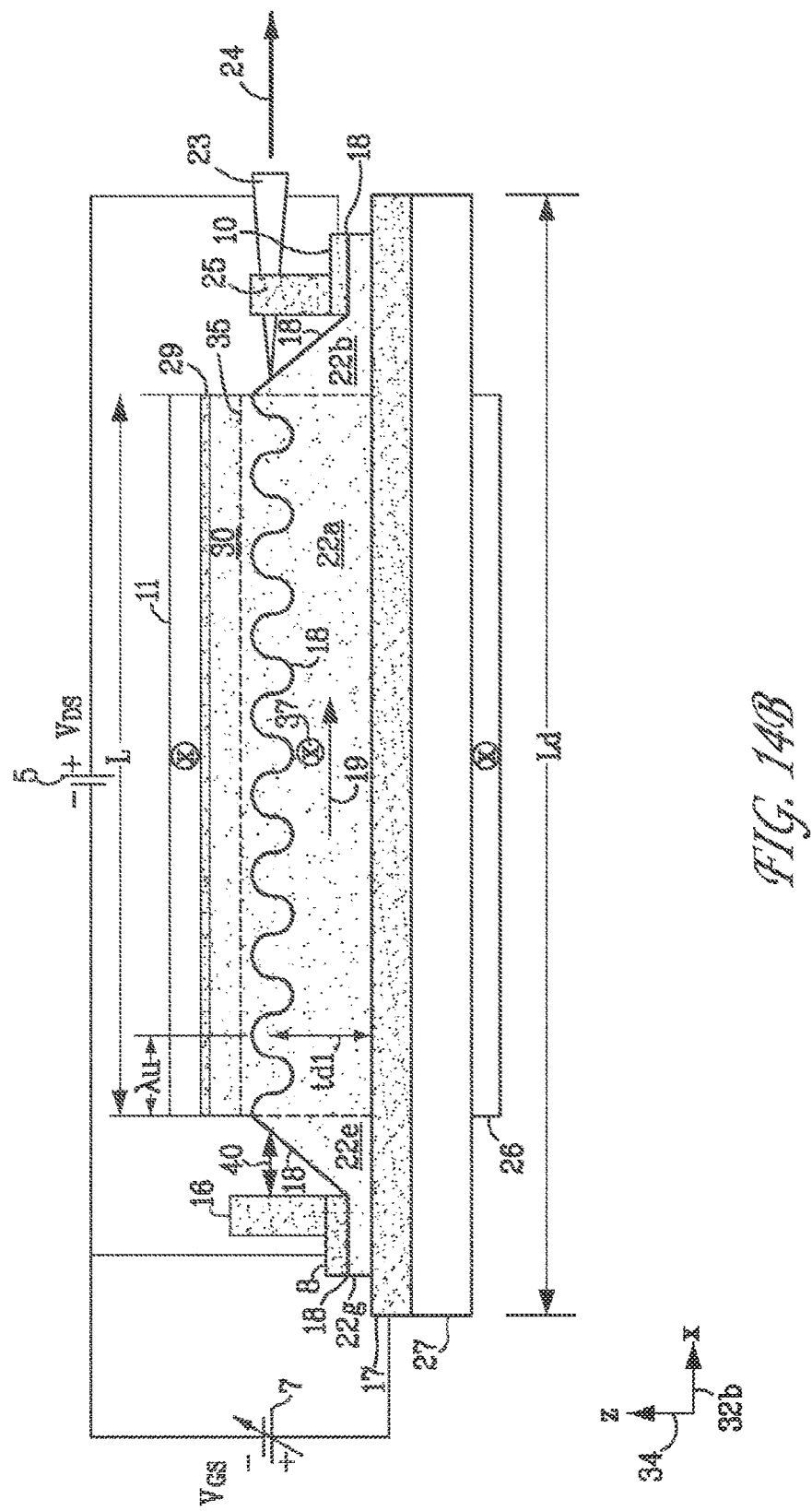
FIG. 14B depicts a cross-sectional side view of the solid state device depicted in FIG. 1A.
Figure 15:
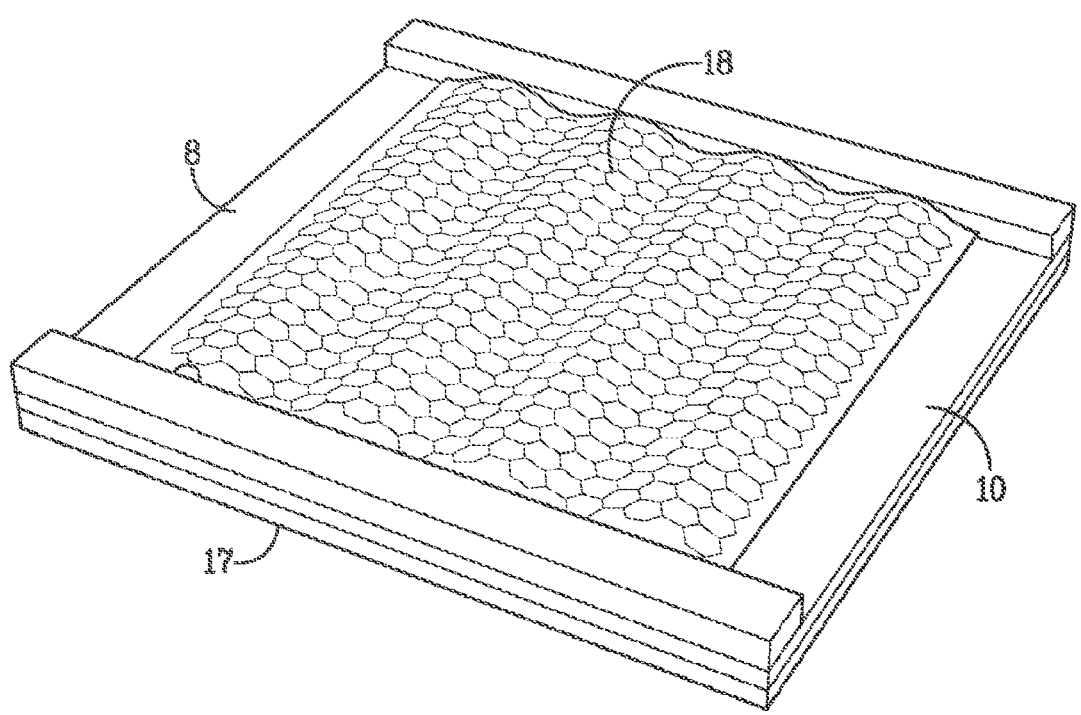
FIG. 15 depicts a perspective view of an embodiment of a solid state device according to the present invention incorporating a Nanoimprint Implementation.

FIGS. 14A & 14B shows a fourth implementation of the device in three dimensions with the top part showing the x-direction 32a and y-direction 33 and the bottom showing the x-direction 32b and z-directions 34. The device has multiple layers to form a Field Effect Transistor (FET) structure. The first layer of the device is a substrate 27 that supports the upper layers. A gate layer 17 is deposited on the substrate 27 and acts to control the electron carrier density in the upper layer and can also act as a reflector for the electromagnetic radiation produced in the graphene 18 layer above. The gate 17 can be used as the substrate 27 in some implementations.

A positive voltage 7 between the gate 17 and source 8 produces large numbers of electrons in the graphene 18 channel between the source 8 and drain 10. The greater the gate-source voltage 7 that is applied, the greater the number of electrons that are present in the graphene 18 channel that connects the source 8 and drain 10. A dielectric layer 22a, b & e is deposited on top of the gate 17 and acts as an electrical insulator between the gate 17 and the graphene 18 layer and contacts 8 & 10. The dielectric layer 22a, b & e is corrugated in the z-direction 34. The corrugations can be formed using lithographic patterning or nano-imprint patterning, for example.

Graphene 18 is deposited on top of the corrugated insulating layer 22a, b & e and acts as a controllable conductive path between the source 8 and drain 10 when a gate voltage 7 is applied. The conductivity of the graphene channel can be increased or decreased by increasing or decreasing the gate-source voltage 7. Graphene 18 is a single layer of carbon atoms that form a hexagon structure. The purpose of the corrugated periodic graphene paths 18 is to produce an acceleration in the x-z-direction 32a, b, & 34 to the electron flowing 19 between the source 8 and the drain 10. The corrugated dielectric with large the graphene layer 18 allows for a large area for electrons to flow and has the advantage of carrying larger carrier densities than nanoribbons or sinusoidal paths. The corrugated dielectric and graphene have a period of λu. This implementation has the advantage of not requiring strong periodic magnetic structures or fields, but just fixed magnetic assembles or layers. It can also be easier to fabricate than implementation with the sinusoidal graphene nanoribbons.

Source 8 and drain 10 metal contacts at each end of the graphene 18 channel are deposited to provide electrical connections to the graphene 18. The source 8 and drain 10 contacts are deposited on thinner dielectric 22b & 22e so that they do not block or interfere with the radiation emanating from the graphene layer 18. A drain-to-source voltage 5 provides an electromotive force that causes the electrons in the graphene layer 18 to flow 19 between the source 8 and drain 10 contacts. Note that conventional current describes the flow of a positively charged carrier between the plus and minus contacts of a battery. The actual electron flow 19 is in the opposite direction.

A back mirror 16 and front filter 25 can be included in the structures on top of the contacts. The back mirror 16 can be the same as the source contact 8 and it reflects the electromagnetic radiation propagating toward the source, back toward the drain 10 where the EM radiation is emitted 23. This also has the effect of doubling the output power at 23 if the spacing between the mirror 16 and the graphene layer 18 is set so that the reflected EM waves do not interfere destructively with the EM propagating toward the drain 10. The front filter 25 can be used to narrow the output bandwidth or select a particular mode of EM radiation, if needed. The size of the back mirror 16 and the front filter 25 depends on the wavelength emitted from the graphene layer 18. Graphene 18 was selected as the best candidate conductor because it has relatively high charge carrier velocity compared to other materials. The graphene layer can be doped to provide higher carrier velocity or higher carrier densities. The graphene 18 layer can be replaced with other materials that offer better performance (higher carrier velocity). The graphene layer 18 can be a single layer of graphene, dual layers or multiple layers separated by air (no dielectric), or by a dielectric.

The dielectric layer 22a, b & e can be fabricated with polymer dielectrics, $SiO_2$, AlN, BN, ZnO, $Al_2O_3$, HfO, $ZrO_2$, diamond films, sapphire, quartz, glass, and SiC, for example. Ideal characteristics of the dielectric material selected must include electrical isolation between the gate 17 and graphene 18 layers, and provide low impurities that interfere with electron transport, low electron-phonon coupling to reduce electron scattering, and transparency to the EM radiation being emitted. The power dissipation of the devices occurs in the graphene layer 18 so it would be advantageous if the dielectric material 22a, b & e selected also provide a high thermal conductivity to conduct heat away from the graphene layer 18. This will reduce the electron-phonon scattering that is temperature dependent and will produce the highest electron transport velocity.

A dielectric layer 30 can be optionally added and covers the graphene layer 18 to provide protection from environmental contamination and to raise the average dielectric constant around the graphene layer 18. The higher dielectric constant results in a higher carrier density for a given gate-to-source voltage 7. This dielectric layer 30 can be capped with a metal layer 29 that acts as a reflector to reflect the EM radiation emitted from the graphene layer back toward the center of the device so that the EM radiation propagates out of the device 23 at the drain 10 in a more directional way instead of from all around the top of the graphene layer 18. The thickness of the dielectric layers 22a, td1 is selected for the breakdown strength of the material and the gate-source voltage 7, the dielectric constant, and carrier density desired for a given gate-source voltage 7. It also can be selected to provide beneficial EM emission as a multiple of the emitted EM waves. A $SiO_2$ wafer, for example, would provide the basis for constructing a device with a 300 nm thick dielectric layer 22a that would provide operation to a gate-source voltage 7 under 300 V. The thickness of the optional dielectric layer 30, td2, depends on the EM radiation wavelength being emitted. The thickness td2 is selected so that reflected waves of the metal cap layer 29 do not destructively interfere with the waves being emitted by the graphene. If a metal cap layer 29 is not used, then the thickness td2 can be selected to match td1 to provide a good average dielectric constant around the graphene layer 18.

The dielectric layers 22a, b, e, & 30 can also be doped with ferromagnetic, paramagnetic, or super paramagnetic materials that can be magnetized in the proper direction (see FIG. 14), or their magnetization aligned with external magnets to produce a stronger local field around the electrons, which gives rise to a stronger acceleration and output power. These dopants should not interfere with the emitted EM radiation or with the velocity of the electrons.

FIG. 15 shows a 3D model of part of synchrotron chip 4. The part of the device shown includes a bottom gate 17, a corrugate dielectric layer under a layer of graphene 18. A source 8 and drain 10 contacts are attached to the graphene layer 18 and are deposited on top of the insulating layer. The corrugated insulating layer can be impressed into a dielectric using nano-imprint lithography.

Figure 16:
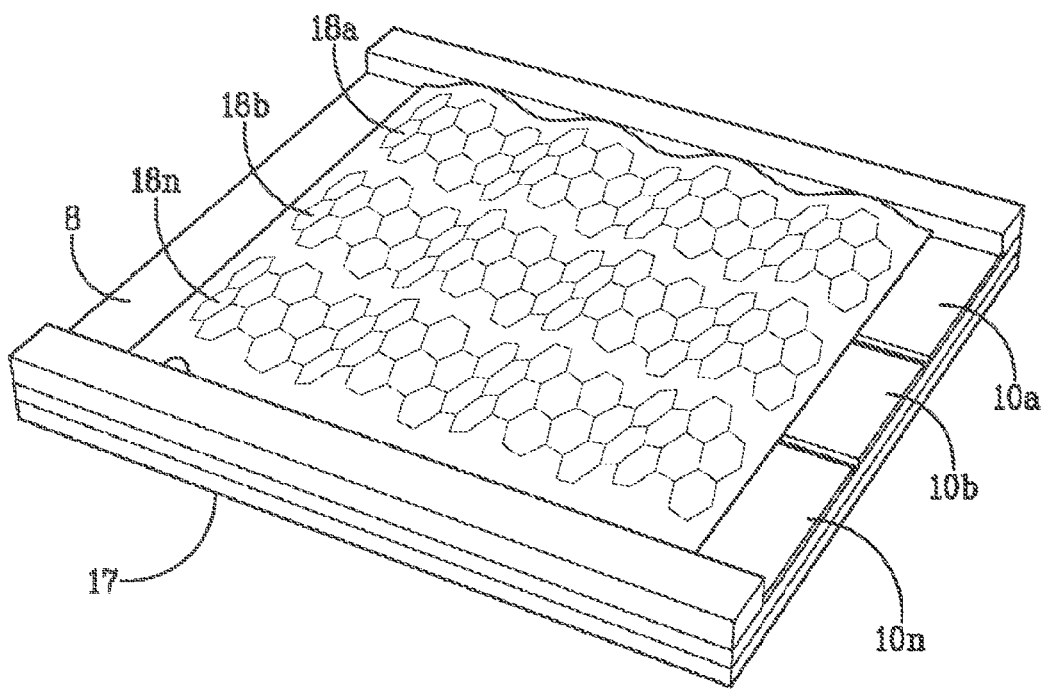
FIG. 16 depicts a perspective view of an embodiment of a solid state device according to the present invention incorporating a Nanoribbon Implementation.

FIG. 16 shows a 3D model of part of synchrotron chip 4 with alternate implementation. The part of the device shown includes a bottom gate 17, a corrugate dielectric layer under a layer of parallel graphene ribbons 18a-n. A source 8 and drain 10a-n contacts are attached to the graphene layer 18a-n and are deposited on top of the insulating layer. Each graphene ribbon can have a different length or phase relation to adjacent graphene ribbons to control the overall radiation pattern using beam forming techniques. Separate drain 10a-n contacts allow each graphene ribbon 18a-n to be driven separately to account for conductivity variation in each ribbon.

FIG. 17 shows a 3D model of part of synchrotron chip 4 with an alternate implementation. The part of the device shown includes a bottom gate 17, a corrugate dielectric layer under a layer of graphene 18. A source 8 and drain 10 contacts are attached to the graphene layer 18 and are deposited on top of the insulating layer. The corrugated insulating layer has areas that are corrugates 18a, areas that are un-corrugated or flat 18b, followed by areas that are corrugated 18c.

The corrugated graphene regions 18a and 18c radiate, while flat graphene regions 18b do not. The length of the corrugated graphene region 18a, c will radiate for a time period followed by a period of no radiation from the flat graphene region 18b. A pulse code can be produced in this way. Changing the period of the corrugations under the graphene 18a, c will yield a different frequency of radiation.

Figure 18:
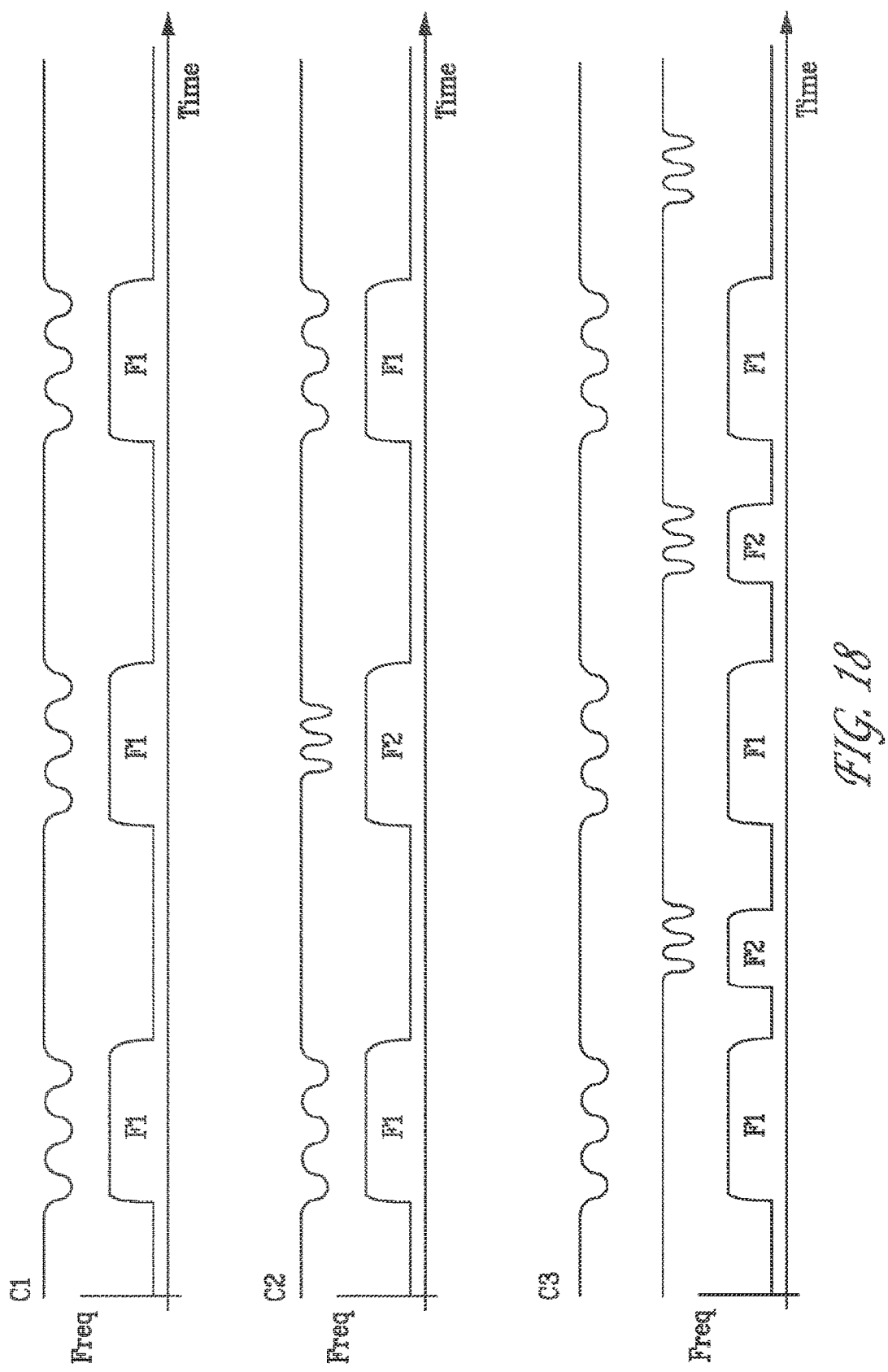
FIG. 18 illustrates a Pulsed EM Output Sequence of a solid state device according to the present invention.
Figure 20:
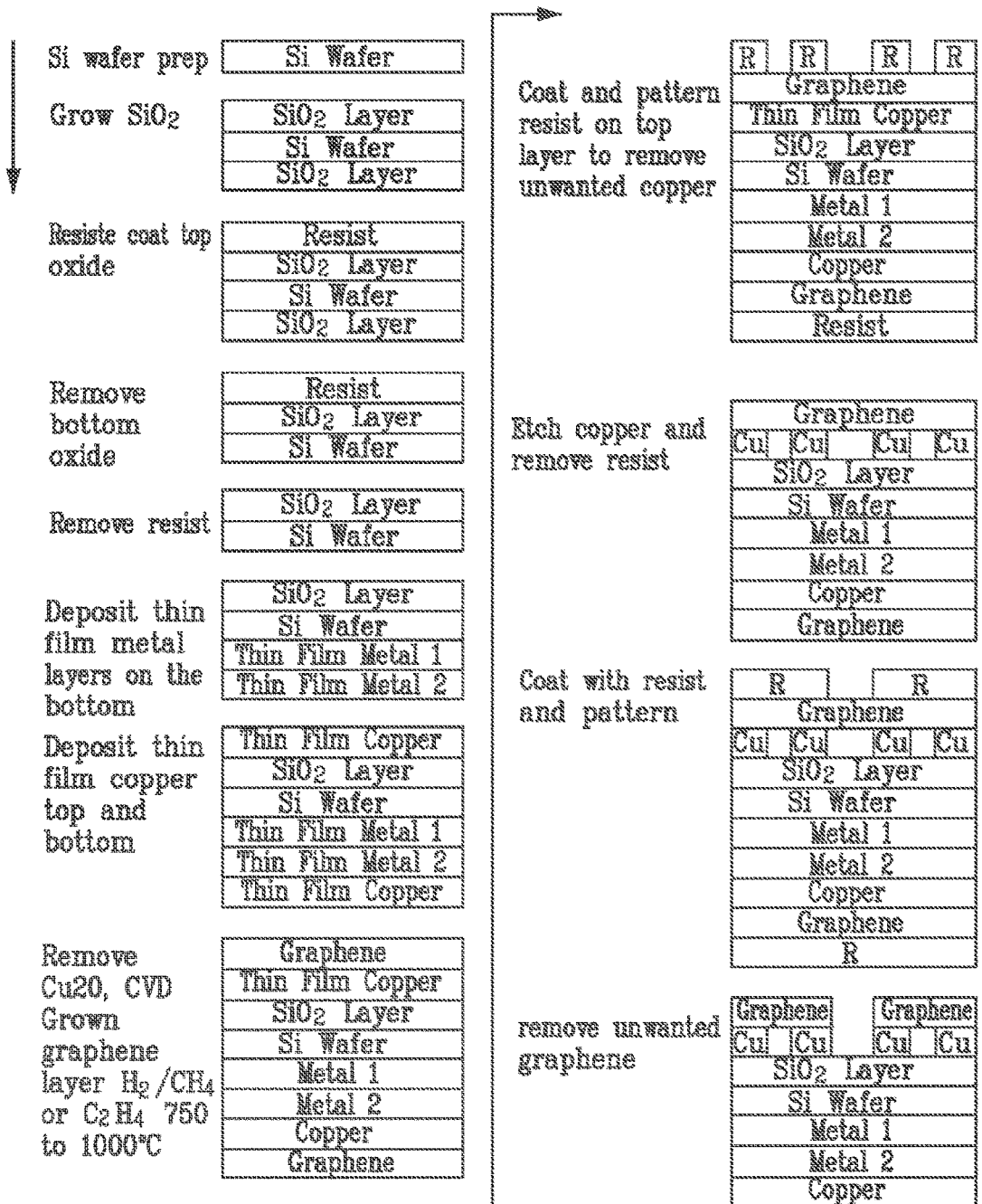
FIG. 20 provides an embodiment of a method for growing and patterning graphene on copper.

FIG. 18 shows just three examples of frequency coding that can be generated with the technique. In case C1, corrugations 18a & c have the same period and produce radiation at the same frequency with repetitive pulses. In case C2, the corrugation period of 18a & 18c are different so frequencies are radiated in sequence. In case C3, the graphene layer is segmented into ribbons, as shown in FIG. 16, and each graphene ribbon has a different period and phase shift so that two different frequencies are radiated at different times in sequence.

The graphene layer 18 is fabricated to have a sinusoid period that is a function of the z-direction 34 with a period λu. The corrugated path is defined by L[x], which describes each point as a 3D vector on the corrugation, as shown in equation (24). Since the corrugations are on the x-z plane, the y-direction is zero.

$$L[x] = \left\{x, 0, \sin\left[\frac{(2\pi x)}{\lambda u}\right]\right\} \quad (24)$$

The vector notation above has shown the general form of {x, y, z}. In this equation, x is the position in the x-direction and the z-component of the corrugation and is described by sine function. An electron must follow this path (sans tunneling) so the velocity vector of the electron will always be pointing in the direction of the path. This direction can be found as function x by computing the unit tangent at x. The unit tangent UT[x] is found to be the derivative of L[x] divided by the magnitude of the derivative of L[x], as shown in equation (14).

The velocity vector is then the unit tangent times the nominal velocity of an electron on the graphene path, as shown in equation (15). The drift velocity, Vx, of an electron in graphene is found using equation (7) and can be as high as $9*10^7$ cm/s. The full expanded form of the velocity vector is shown in equation (25) to illustrate the sinusoidal components in the velocity vector.

$$V[x] = \frac{Vx\left\{1, 0, \frac{2\pi}{\lambda u}\cos\left[\frac{2\pi x}{\lambda u}\right]\right\}}{\left\|\left\{1, 0, \frac{2\pi}{\lambda u}\cos\left[\frac{2\pi x}{\lambda u}\right]\right\}\right\|} \quad (25)$$

A constant magnetic field, B, is applied that is perpendicular to the sinusoidal corrugation of the electrons and points only in the y-direction 33 across the graphene layer as per the right hand rule (see FIG. 14). The symbol ⊗ 37 indicates that the magnetic field is "pointing into the page" for magnets 11, 26, 35, & 36.

$$B = \{0, Bo, 0\} \quad (26)$$

A Lorentz force is thus generated due to the electric field, electron velocity, and the static magnetic field in this implementation is shown in the equation (18) where Q is the charge of an electron. Ee is the electric field in the minus x-direction 32a & b and is calculated from the geometry of the device as $$Ee = \left\{-\frac{Vds}{Lu}, 0, 0\right\} \quad (27)$$

where Vds is the drain-source voltage 5 and Lu is the total length of the drain-source path. The total path length is found in equation (20) and (21). Where Nu is the number of path periods in the length L of the graphene corrugation (see FIG. 14).

Using F=ma the acceleration on the electron due to the Lorentz force on the electron is found in equation (22). Where Me is the effective mass of the electron in graphene. This acceleration on the electrons will result in EM radiation emissions. This acceleration is also perpendicular to the velocity so the radiation pattern has a toroid or donut shape oriented so that the donut hole aligns with the direction of acceleration, as shown in FIG. 6. As the electron flows along the sinusoidal graphene corrugations 18, the radiation pattern would look like-donut or wheel rolling along the sinusoidal graphene corrugations 18 with the donut hole or axel being parallel to the graphene layer.

The total instantaneous power radiated from the electron is computed using the Poynting vector (S=E×H) and integrated around solid angle of the radiation as shown in equation (6). Total average power is found by averaging over one cycle and found as P/2. The radiated power from a single electron is very small because the acceleration is small due to the non-relativistic electron velocity, but the structure has three key design parameters that allow the production higher output power.

The first is high electron densities that are controlled by applying higher gate-source voltages 7 to a limit, the second is by increasing the active area of the device (W*L), and third is by increasing the number of layers. The limitation on carrier density occurs because at some point the higher carrier density begins to impede the carrier velocity, which begins to limit the acceleration and dim the output power. In this case, too many electrons are getting in the way of each other so the electron velocity begins to drop due to increased electron-electron scattering. Electron densities of greater then $10^{12}/cm^2$ have been described in the literature.

The Fermi electron velocity through graphene is determined by the honeycomb geometry of graphene and the π-orbitals of the carbon, and is reported as $1.00337*10^8$ cm/second. The drift electron velocity is computed as shown in equation (7). Equation (7) yields an electron velocity in the range of $1*10^7$ cm/s to of $1*10^8$ cm/s, and this depends on the mobility and the phonon energy levels of the dielectric layer 22a-c, e, g & 30. When the Fermi energy level, which is determined by the carrier density and controlled by the gate voltage, becomes equal or greater than the phonon energy level, then the carrier velocity begins to decrease due to electron-phonon scattering.

The carrier density for the graphene sinusoidal paths is found in equation (9) with the gate capacitance found in equation (8). The carrier (electron) density is a function of the gate-source voltage 7. The carrier density has been reported to range from $10^9/cm^2$ to $5*10^{12}/cm^2$ in the literature. With the carrier density, the total average output power is power output from one electron times the total number of electrons in the graphene as calculated shown in equation (11). Since the carrier density is a function of gate voltage 7, the output power can be controlled by varying the gate voltage.

In this implementation, the velocity vector is sinusoid due to the sinusoidal corrugations and the magnetic field is constant. As a result of the Lorentz forces, the acceleration becomes periodic as well and has the period of the sinusoidal path. The emitted frequency of the emitted EM radiation is shown in equation (23) and is related to the velocity of the electron divided by the period of the sinusoidal path period λu.

The frequency, fu, is no longer limited by the difficulties of creating small powerful periodic magnet assembles to get a high frequency output. The highest output frequency is limited by the smallest sinusoidal path period that can be made, which becomes a limitation of nanolithography so much higher frequencies can be generated.

The analysis presented above describes the continuous and uniform acceleration of a large number of electrons in the graphene to emit EM radiation. This process can be interfered with or enhanced by impurities, defects, or dopants on the graphene 18 or in dielectric layers around the graphene 22a & 30. If the impurities, defects, or dopants would interfere with the EM process by slowing down the electrons and thus decreasing the acceleration of the electron reducing the radiated power, then they must be eliminated or minimized.

However, the impurities, defects, or dopants can be used to enhance the EM radiation by increasing or supplementing the acceleration or deceleration of the electrons. If an impurity, defect, or dopant is positively charged or polar in nature, then an electron should experience an additional deflection in its trajectory that results in an acceleration or deceleration of the electron which could result in additional EM radiation emissions, for example. This radiation process is known as Bremsstrahlung or breaking radiation.

The EM radiation characteristics like wavelength, spectrum, or bandwidth can be enhanced by impurities, defects, or dopants through the use of Forester Radiative Energy Transfer (FRET). The energy from the electrons is radiatively coupled to the impurity, defect, or dopant. The impurity, defect, or dopant absorbs this energy and re-radiates the energy at a different wavelength via a phosphorescence process. The electron radiation from the graphene 18 must be emitted in an energy band or frequency that overlaps with the absorption band of the impurity, defect, or dopant. The impurity, defect, or dopant will emit radiation or light at a lower energy level than what was absorbed due to losses in the energy transfer process, but the wavelength or spectrum can be more desirable. The impurities, defects, or dopants must be within 10 nm of the electrons in the graphene layer for this energy transfer to be effective.

The EM emissions from the device occur from the use of DC voltages and do not necessarily require complex oscillators to produce this EM radiation.

The magnet arrays 4 & 11 in the prototype, shown in FIG. 8 can be reconstructed using larger and stronger Neodymium Iron Boron (NdFeB) magnets. Each magnet array 4 & 11 contains magnets with the poles oriented to with the magnetization direction all in one direction. The larger magnets can measure 2×2×2 inches and produce a magnetic field around 3700 Gauss 0.4 inches away from the surface. The magnet holders 1 & 12 will need to be increased in thickness to hold the larger magnets. These magnets and a wafer with corrugated graphene should produce about 9.6 mW of output power at 99 THz. FIG. 19 shows the operating and performance parameters for the as modified prototype shown in FIG. 8.

The average periodic surface roughness of the dielectric under the graphene layer could be measured in this configuration by measuring all the frequency components that are emitted.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed:

1. A solid state device capable of emitting electromagnetic radiation, comprising:
   a gate layer capable of controlling electron density in one or more upper layers;
   a first dielectric layer disposed directly on the gate layer;
   a graphene layer disposed adjacent to the first dielectric layer;
   a source disposed adjacent to, and in electrical communication with, the graphene layer;
   a drain disposed adjacent to, and in electrical communication with, the graphene layer, wherein the source and the drain are disposed at distal ends of the graphene layer, wherein application of an electromotive force between the source and drain gives rise to an electrical current in the graphene layer; and
   an alternating magnetic field source disposed proximate to the at least one graphene layer, wherein operation of the alternating magnetic field source gives rise to an alternating magnetic field oriented substantially perpendicular to the graphene layer, wherein said alternating magnetic field is capable of being operatively coupled to said electrical current to give rise the electromagnetic radiation produced from the graphene layer, wherein the graphene layer is characterized as having one or more linear dimensions other than its thickness, wherein the one or more linear dimensions have one or more of:

at least about 1, 2, 3, 4, 5, 6, or 8 inches in diameter adjacent to a $SiO_2$ or a quartz wafer:

on glass wafers having dimensions of about 10×10 mm, about 20×20 mm, about 100×100 mm, or from about 2 to 8 inches;

about two inches in diameter on a standard SiC wafer;

from about one inch square to about 4.5 inches square for an $Al_2O_3$ substrate;

from about 1.9 inches square to 6 inches square for an AlN substrate; and about 30 inches wide by 200 feet long on a CVD roll-to-roll processing equipment; and about 1 µm to about 97 cm for multiple devices in parallel.

2. The solid state device of claim 1, wherein a plurality of layers forms a Field Effect Transistor structure for generating a field-effect n-doping or p-doping in the graphene layer.

3. The solid state device of claim 1, wherein the gate layer is capable of reflecting the electromagnetic radiation produced in the graphene layer disposed proximate to the gate layer.

4. The solid state device of claim 1, wherein the gate layer comprises one or more of the following material: conductors, doped semiconductors, doped Si, conductive polymers, ITO, transparent conductive polymers, and graphene.

5. The solid state device of claim 1, further comprising a substrate layer, wherein the gate layer is disposed adjacent to the substrate layer.

6. The solid state device of claim 1, wherein the first dielectric layer comprises one or more of the following materials: polymer dielectrics, inorganic insulators, electrolytes, SiO2, AlN, BN, ZnO, Al203, HfO, ZrO2, diamond films, sapphire, quartz, glass, and SiC.

7. The solid state device of claim 1, wherein the alternating magnetic field source comprises one or more of the following: a Halback array, permanent magnets assembled in a collection with alternating field polarity, series of parallel wires with current flowing in alternating directions, electromagnets arranged in a collection with alternating field polarity, a magnetic film that has been permanently magnetized with arrays of alternating field domains using an external magnetizing device, a magnetizable ferromagnetic metal that has been permanently magnetized with arrays of alternating field domains using an external magnetizing device, a multilayer film deposited with an anti-ferromagnetic exchange bias pinning layer that alternates magnetic polarity on top of a ferromagnetic metal, an array of beams of polarized light, an array of beams of polarized laser light with alternating B-field polarity, and periodic structures of dilute magnetic semiconductors arranged with alternate polarity.

8. The solid state device of claim 1, wherein the alternating magnetic field source varies the magnetic field spatially, temporally, or any combination thereof.

9. The solid state device of claim 1, wherein the alternating magnetic field source that varies the magnetic field spatially comprises one or more of the following:

an array of Neodymium Iron Boron permanent magnets mounted and arranged with alternating magnetic poles;

a Halback configuration having a magnetic period and capable of producing a 1500 to 3000 Gauss magnetic field perpendicular to the graphene layer;

a magnetic array in a magnetic film comprising one or more ferromagnetic materials, the magnetic film comprising alternating field domains characterized as having a magnetic field strength of 10,000 to 20,000 Gauss with alternating field domains having a dimension as small as 180 nm;

a magnetic array in a magnetic film comprising one or more anti-ferromagnetic materials characterized as having magnetic domains having a dimension as small as 400 nm; and an array of polarized light beams or an array polarized laser light beams with alternating B-field polarity.

10. The solid state device of claim 1, wherein the graphene layer is characterized as being a single layer thick of bonded carbon atoms.

11. The solid state device of claim 1, wherein the graphene layer is characterized as multiple layers of bonded carbon atoms.

12. The solid state device of claim 11, wherein the number of layers of bonded carbon atoms is in the range of from two to tens of thousands.

13. The solid state device of claim 1, wherein the graphene layer comprises a dopant.

14. The solid state device of claim 13, wherein the dopant comprises one or more of the following dopants: organic materials, organic polymers, pigments, quantum dots, phosphorescent molecules, photoluminescent molecules, semiconductors, carbon nanotubes, fullerenes, elements, molecules, metals, ferromagnetic nanoparticles, and metal nanoparticles.

15. The solid state device of claim 1, further comprising a dielectric layer, wherein a second or more dielectric layers are optionally disposed on the graphene layer.

16. The solid state device of claim 1, wherein the source comprises one or more of the following materials: conductive polymers, semiconductors, doped semiconductors, and metals.

17. The solid state device of claim 1, wherein the drain comprises one or more of the following materials: conductive polymers, semiconductors, doped semiconductors, and metals.

18. The solid state device of claim 1, further comprising a back mirror disposed proximate to the source.

19. The solid state device of claim 1, further comprising a front filter disposed proximate to the drain.

20. The solid state device of claim 19, wherein the front filter is disposed directly adjacent to one or more dielectric layers, wherein at least one of the dielectric layers is disposed directly adjacent to the drain and the front filter.

21. The solid state device of claim 20, wherein the dielectric layer disposed directly adjacent to the drain and the front filter is characterized as having a thickness that provides an integer number a wavelengths spacing between the mirror and filter to for a cavity to create a resonate cavity.

22. The solid state device of claim 11, wherein each graphene layer is one atom thick, wherein the layers are spaced 0.34 nm apart in multilayer graphene, or spaced farther apart by including an insulating material between each graphene layer to form a graphene-dielectric superlattice, wherein a thickness of the dielectric layer ranges from 1 nm to 100s of nm using deposition techniques, or to centimeters if glass slides or quartz substrates are used, wherein the graphene layer is disposed between the first dielectric layer and the second dielectric layer, wherein one of the dielectric layers is disposed directly adjacent to the gate layer.

* * * * *